US010890527B2

(12) United States Patent
Jeon

(10) Patent No.: US 10,890,527 B2
(45) Date of Patent: Jan. 12, 2021

(54) EUV MASK INSPECTION APPARATUS AND METHOD, AND EUV MASK MANUFACTURING METHOD INCLUDING EUV MASK INSPECTION METHOD

(71) Applicant: Samsung Electronics Co., Ltd., Suwon-si (KR)

(72) Inventor: Byeong-hwan Jeon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 16/235,268

(22) Filed: Dec. 28, 2018

(65) Prior Publication Data
US 2020/0003685 A1   Jan. 2, 2020

(30) Foreign Application Priority Data

Jun. 28, 2018   (KR) .......... 10-2018-0074924
Jul. 25, 2018   (KR) .......... 10-2018-0086813

(51) Int. Cl.
*G01N 21/55*   (2014.01)

(52) U.S. Cl.
CPC ....... *G01N 21/55* (2013.01); *G01N 2201/061* (2013.01); *G01N 2201/068* (2013.01); *G01N 2201/105* (2013.01)

(58) Field of Classification Search
CPC ......... G01N 2021/95676; G01N 21/55; G01N 21/95623; G01N 2201/061; G01N 2201/068; G01N 2201/10; G01N 2201/105; G03F 1/84
See application file for complete search history.

(56) References Cited

U.S. PATENT DOCUMENTS

| 4,704,033 A | 11/1987 | Fay et al. |
| 5,834,767 A | 11/1998 | Hasegawa et al. |
| 6,738,135 B1 * | 5/2004 | Underwood ......... G01N 21/956 356/237.5 |
| 6,864,490 B1 * | 3/2005 | Underwood ............. G01J 3/18 250/461.1 |
| 7,268,945 B2 | 9/2007 | Yun et al. |
| 8,305,558 B2 | 11/2012 | Gruner et al. |

(Continued)

FOREIGN PATENT DOCUMENTS

| JP | H 2545582 | 1/1990 |
| JP | 2011-153903 A | 8/2011 |

*Primary Examiner* — Marcus H Taningco
(74) *Attorney, Agent, or Firm* — Harness, Dickey & Pierce, P.L.C.

(57) ABSTRACT

Provided are a method and an apparatus for inspecting an extreme ultraviolet (EUV) mask at a high speed with high optical efficiency, and a method of manufacturing the EUV mask, wherein the method of inspecting the EUV mask is included in the method of manufacturing the EUV mask. The apparatus for inspecting the EUV mask includes a light source configured to generate and output light, a linear zone plate configured to convert the light from the light source to light having a linear form, a slit plate configured to output the light having the linear form by removing a higher-order diffracted light component from the light having the linear form, a stage on which the EUV mask is located, and a detector configured to detect the light reflected from the EUV mask, in response to the light being irradiated onto and reflected from the EUV mask.

15 Claims, 19 Drawing Sheets

(56) References Cited

U.S. PATENT DOCUMENTS

| | | |
|---|---|---|
| 9,915,621 B2 | 3/2018 | Foad et al. |
| 10,319,088 B2 * | 6/2019 | Miyai ........................ G03F 1/84 |
| 2011/0181868 A1 * | 7/2011 | Stokowski ............. B82Y 40/00 |
| | | 356/51 |
| 2013/0017475 A1 * | 1/2013 | Terasawa .................. G03F 1/22 |
| | | 430/5 |
| 2013/0056642 A1 * | 3/2013 | Lee ........................ B82Y 10/00 |
| | | 250/372 |
| 2013/0161543 A1 | 6/2013 | Park et al. |
| 2013/0342820 A1 * | 12/2013 | Kajiyama ........... G03F 7/70358 |
| | | 355/67 |
| 2016/0282280 A1 * | 9/2016 | Foad ....................... G01N 21/95 |
| 2017/0090172 A1 | 3/2017 | Johnson |
| 2017/0221194 A1 | 8/2017 | Ebstein |
| 2017/0256045 A1 | 9/2017 | Miyai et al. |

\* cited by examiner

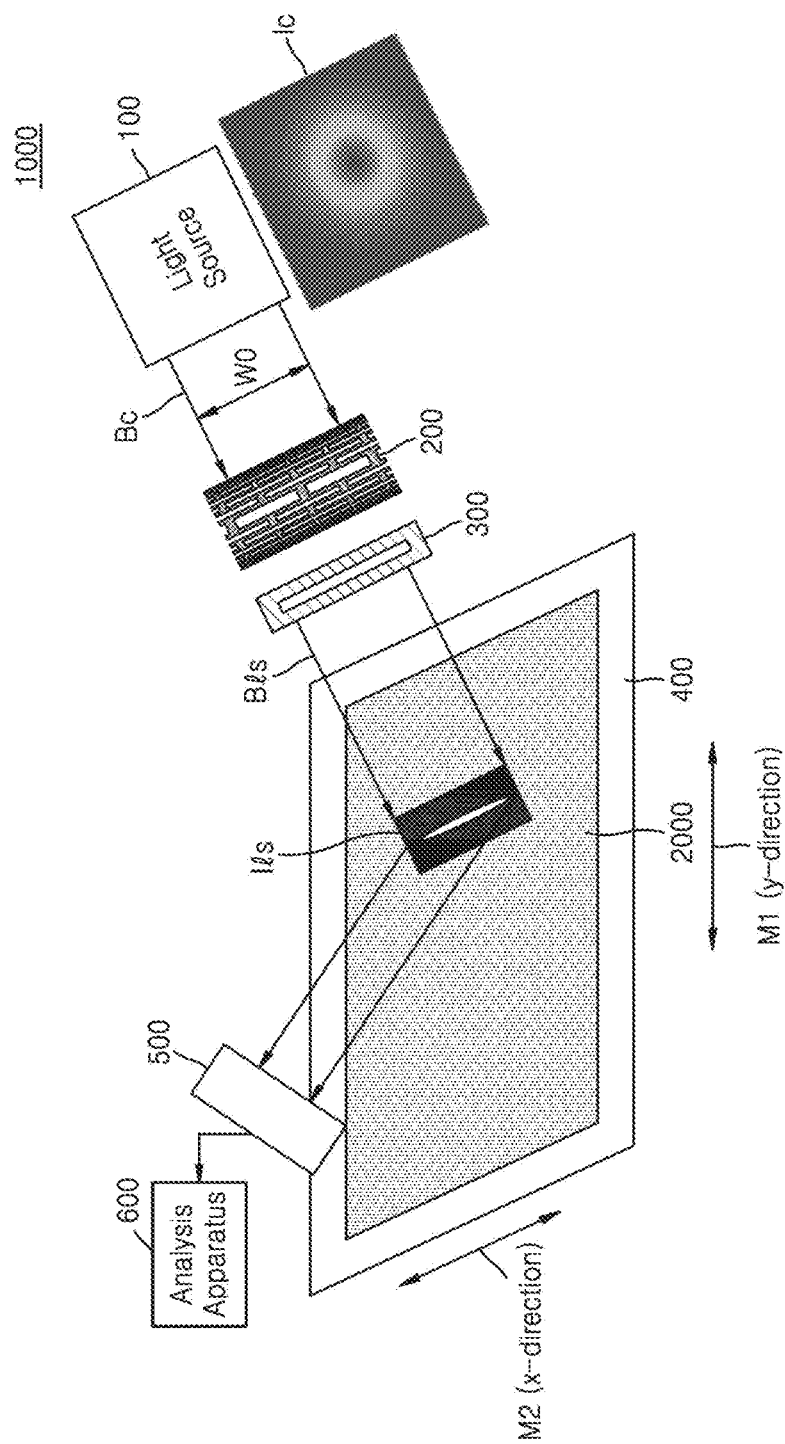

EUV MASK INSPECTION APPARATUS AND METHOD, AND EUV MASK MANUFACTURING METHOD INCLUDING EUV MASK INSPECTION METHOD

CROSS-REFERENCE TO RELATED APPLICATIONS

This application claims the benefit of Korean Patent Applications No. 10-2018-0074924, filed on Jun. 28, 2018, in the Korean Intellectual Property Office, and No. 10-2018-0086813, filed on Jul. 25, 2018, in the Korean Intellectual Property Office, the disclosures of each of which are incorporated herein in their entirety by reference.

BACKGROUND

Inventive concepts relate to a method and/or an apparatus for inspecting an extreme ultraviolet (EUV) mask, and more particularly, to a method and/or an apparatus for inspecting an EUV mask at a high speed.

Recently, line widths of semiconductor circuits have become finer, and accordingly, light sources of a shorter wavelength have been utilized. For example, extreme ultraviolet (EUV) radiation has been used as a light source for exposure. Due to an absorption characteristic of the EUV rays, a reflective EUV mask is generally used in an EUV exposure process. When the degree of difficulty of the exposure process increases, a small error in an EUV mask may cause a significant failure in a circuit pattern on a wafer. Thus, an EUV mask inspection process for inspecting whether there is a defect in the EUV mask may be performed. Here, the defect may include the existence of a contaminant, such as a fine particle on the EUV mask, and/or an error in a shape or size of a pattern formed on the EUV mask.

SUMMARY

Inventive concepts provides a method and an apparatus for inspecting an extreme ultraviolet (EUV) mask at a high speed with high optical efficiency, and a method of manufacturing the EUV mask, wherein the method of inspecting the EUV mask is included in the method of manufacturing the EUV mask.

According to some example embodiments of inventive concepts, there is provided an apparatus for inspecting an extreme ultraviolet (EUV) mask, the apparatus including a light source configured to generate and output light, a linear zone plate configured to convert the light from the light source to light having a linear form, a slit plate configured to output the light having the linear form by removing a higher-order diffracted light component from the light having the linear form, a stage on which the EUV mask is located, and a detector configured to detect the light reflected from the EUV mask, in response to the light being irradiated onto and reflected from the EUV mask.

According to some example embodiments of inventive concepts, there is provided an apparatus for inspecting an extreme ultraviolet (EUV) mask, the apparatus including a light source configured to generate and output light, a scan mirror configured to reflect and output the light from the light source by reflecting the light in a first direction, a linear zone plate configured to output the light from the scan mirror as light having a linear form extending in the first direction, a slit plate configured to output the light having the linear form by removing a higher-order diffracted light component from the light having the linear form, and a first detector configured to detect the light reflected from the EUV mask, in response to the light being irradiated onto and reflected from the EUV mask.

According to some example embodiments of inventive concepts, there is provided a method of inspecting an extreme ultraviolet (EUV) mask, the method including generating light in a light source and outputting the light from the light source, outputting, via a linear zone plate, the light from the light source as light having a linear form extending in a first direction, outputting, via a slit plate, the light having the linear form by removing a higher-order diffraction component from the light having the linear form, and detecting, via a first detector, reflected light from the EUV mask, in response to the light having a linear form being irradiated onto and reflected from the EUV mask.

According to some example embodiments of inventive concepts, there is provided a method of manufacturing an extreme ultraviolet (EUV) mask, the method including generating light in a light source and outputting the light from the light source, outputting, via a linear zone plate, the light from the light source as light having a linear form extending in a first direction, outputting, via a slit plate, the light having the linear form by removing a higher-order diffraction component from the light having the linear form, detecting, via a first detector, reflected light from the EUV mask, in response to the light having the linear form being irradiated onto and reflected from the EUV mask, via an analysis apparatus, analyzing the detected light via an analysis apparatus, determining whether there is a defect in the EUV mask via the analysis apparatus, and in response to there being no defect in the EUV mask, performing a sequential process on the EUV mask.

BRIEF DESCRIPTION OF THE DRAWINGS

Example embodiments of inventive concepts will be more clearly understood from the following detailed description taken in conjunction with the accompanying drawings in which:

FIG. 1 is a structural view schematically illustrating an apparatus for inspecting an extreme ultraviolet (EUV) mask, according to an example embodiment;

DETAILED DESCRIPTION OF EXAMPLE EMBODIMENTS

Figure 2A:
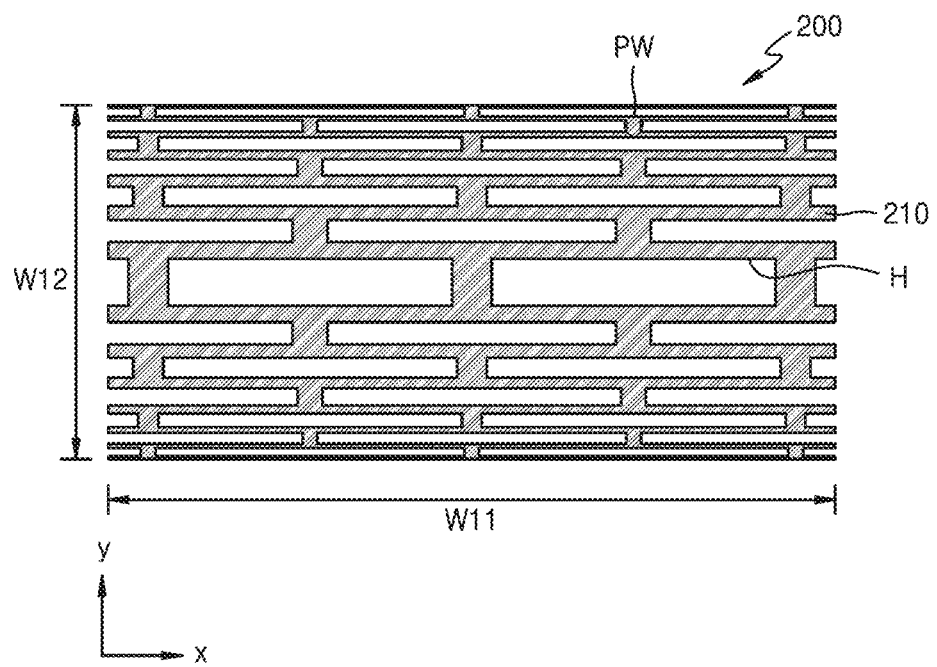
FIG. 2A is a plan view of a linear zone plate in the apparatus for inspecting the EUV mask of FIG. 1.

Hereinafter, embodiments of inventive concepts will be described in detail with reference to the accompanying drawings. Like reference numerals in the drawings refer to the like elements throughout, and their descriptions may not be repeated.

FIG. 1 is a structural view schematically showing an apparatus 1000 for inspecting an extreme ultraviolet (EUV) mask according to an example embodiment.

Referring to FIG. 1, the apparatus 1000 for inspecting the EUV mask according to an example embodiment may include a light source 100, a linear zone plate 200, a slit plate 300, a stage 400, a detector 500, and an analysis apparatus 600.

The light source 100 may generate and output light Bc. The light source 100 may generate and output the light Bc having a short wavelength. For example, the light source 100 may generate and output any one of EUV rays, deep ultraviolet (DUV) rays, and X-rays. In the apparatus 1000 for inspecting the EUV mask according to an example embodiment, the light source 100 may be or include, for example, an EUV light source generating the EUV rays.

The light Bc may be output from the light source 100 as light having a circular shape. Here, the light having the circular shape may denote light having a circular shape on a cross-section that is perpendicular to a direction in which the light progresses. A picture Ic of the light having the circular shape is illustrated below the light source 100. Meanwhile, in a case of the light having the circular shape, an intensity of light decreases with a Gaussian distribution, and a size, or spot size, of the light may be defined as a distance between two points each having an optical intensity according to some example embodiments, such as a certain full width at half maximum (FWHM). However, the size of the light having the circular shape may be defined based on different criteria. In the apparatus 1000 for inspecting the EUV mask according to an example embodiment, the size of the light Bc from the light source 100 may have an initial width W0. For example, the initial width W0 may be between hundreds of μms and dozens of mms. However, the size of the light Bc from the light source 100 is not limited thereto. In the apparatus 1000 for inspecting the EUV mask according to an example embodiment, the light Bc from the light source 100 may be coherent light like a laser beam, as opposed to non-coherent light that spreads.

The light source 100 may include a plasma-based light source, such as a laser-produced plasma (LPP) light source or a discharge-produced plasma (DPP) light source. The plasma-based light source may refer to a light source configured to generate a plasma and use light emitted by the plasma. The LPP light source may generate a plasma by irradiating an intense laser beam onto a specific material and the DPP light source may generate a plasma by releasing a high current pulse between electrodes in a specific gas environment. The DPP light source may be referred to as a gas plasma source and may be implemented at a lower cost than the LPP light source.

In the apparatus 1000 for inspecting the EUV mask according to an example embodiment, the light source 100 may be the DPP light source. Accordingly, the apparatus 1000 for inspecting the EUV mask according to an example embodiment may contribute to reduction of a cost of manufacturing equipment of an EUV mask and a manufacturing cost of the EUV mask, based on the less expensive light source 100. However, in apparatus 1000 for inspecting the EUV mask according to an example embodiment, the type of the light source 100 is not limited to the DPP light source.

Figure 2B:
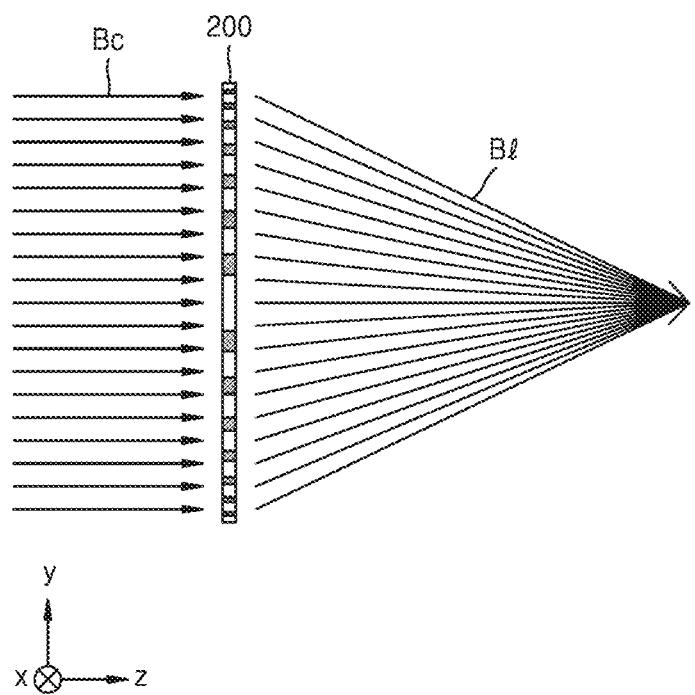
FIG. 2B is a conceptual view for describing a phenomenon in which light is concentrated via the linear zone plate of FIG. 2A.
Figure 2C:
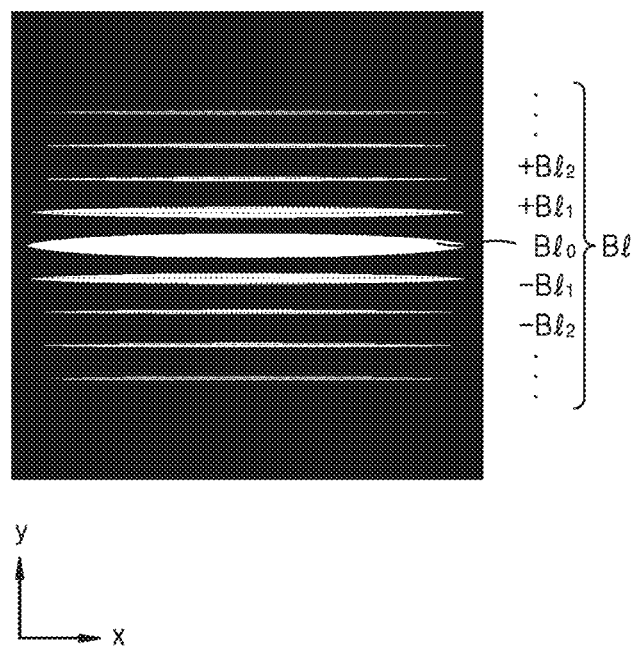
FIG. 2C is a conceptual view for describing a shape of light that is output via the linear zone plate of FIG. 2A.

The linear zone plate 200 may convert the light Bc from the light source 100 into light having a linear form to output the line light, as shown in more detail in Bl of FIG. 2B or 2C. Hereinafter, the "light having a linear form" may also be referred to as "line light. The linear zone plate 200 may output the line light Bl by converting the light Bc into the line light Bl, via diffraction. A structure and a function of the linear zone plate 200 will be described in more detail with reference to FIGS. 2A through 2C.

The slit plate 300 may output line light Bls by suppressing a higher-order diffracted light component from the line light Bl from the linear zone plate 200. Here, the higher-order diffracted light component may denote a ± $1^{st}$-order or greater diffracted light component. However, the higher-order diffracted light component is not limited thereto. The line light Bls from which the higher-order diffracted light component is removed by the slit plate 300 may be irradiated onto an EUV mask 2000. A picture Ils with respect to the line light Bls irradiated via the slit plate 300 is illustrated at the EUV mask 2000. A structure and a function of the slit plate 300 will be described in more detail with reference to FIGS. 3A through 3C.

The stage 400 is a device, on which the EUV mask 2000, which is an object to be inspected, is arranged, and may support the EUV mask 2000. Also, the stage 400 may move on an x-y plane in a first direction (e.g., an x direction) and a second direction (e.g., a y direction), as indicated by both arrows M1 and M2, to move the EUV mask 2000 on the x-y plane in the first direction (the x direction) and the second direction (the y direction). According to an example embodiment, the stage 400 may also move in a third direction (e.g., a z direction).

By moving the EUV mask 2000 on the x-y plane in the first direction (the x direction) and the second direction (the y direction) by the stage 400, the line light Bls output from the slit plate 300 may be irradiated onto the whole EUV mask 2000. For example, in a process of inspecting the EUV mask 2000, the whole EUV mask 2000 may be scanned via the movement of the stage 400.

Meanwhile, the EUV mask 2000 may be or include any one of a blank mask, a patterned mask not covered by one or more pellicles, and a blank or patterned mask covered by one or more pellicles.

The blank mask is a mask on which a pattern is not formed and may have a structure in which a reflective multi-layer for reflecting EUV rays is formed on a substrate, the substrate including a low thermal expansion coefficient material (LTEM), such as quartz. Here, the reflective multi-layer may have a structure in which, for example, dozens of Mo layers and Si layers are stacked, e.g. alternately stacked.

The patterned mask may have a structure in which patterns of an absorption layer are formed on the reflective multi-layer. The absorption layer may include a material having a high absorption degree with respect to EUV rays. The absorption layer may include, for example, at least one of TaN, TaNO, TaBO, Ni, Au, Ag, C, Te, Pt, Pd, Cr, etc. However, materials of the absorption layer are not limited thereto. Meanwhile, a buffer layer may be formed on the reflective multi-layer to protect the reflective multi-layer. The buffer layer may include, for example, at least one of $SiO_2$, SiON, Ru, C, Cr, CrN, etc. However, materials of the buffer layer are not limited thereto.

The mask covered with at least one pellicle may include a pellicle coupled to a patterned mask. The pellicle may cover an upper surface of the mask and may prevent or reduce patterns on the mask from being contaminated by impurity particles.

In a process of inspecting the EUV mask 2000, in the case of the blank mask, for example, a defect of the structure or a degree of reflection of the reflective multi-layer may be inspected. Also, in the case of the patterned mask, a defect of a shape or a size of the patterns of the absorption layer, or introduction of a foreign material may be inspected. Meanwhile, in the case of the mask covered with a pellicle, a defect related to the coupling of the pellicle or impurity introduction may be inspected.

The detector 500 may detect the light reflected from the EUV mask 2000. The detector 500 may include, for example, at least one of a line scan camera, a time-delayed integration (TDI) camera, a two-dimensional (2D) camera, a one-pixel detector, and/or a photo-diode array (PDA) detector. When a size of the light reflected from the EUV mask 2000 is large, the detector 500 may be implemented as, for example, a line scan camera, a TDI camera, and/or a 2D camera. In the apparatus 1000 for inspecting the EUV mask according to an example embodiment, the detector 500 may be a TDI camera. For reference, the TDI camera is a camera which includes a plurality of pixels having a linear form, and the TDI camera may obtain a vivid image by capturing an object by a plurality of times with a certain time interval and overlapping images obtained by the capturing of the object a plurality of times.

Meanwhile, in general, the camera may include an amplifier and an analog-digital converter (ADC). However, the one-pixel detector or the PDA detector may not include an amplifier and an ADC. Accordingly, when the detector 500 is or includes a one-pixel detector or a PDA detector, an amplifier and an ADC may be additionally connected to the detector 500.

The analysis apparatus 600 may be connected to the detector 500 and may receive and analyze an optical signal detected by the detector 500. For example, the analysis apparatus 600 may receive and analyze the line light reflected from the EUV mask 2000. Here, the optical signal used for the analysis may be or include an optical signal having passed through the amplifier and the ADC. Via the analysis of the analysis apparatus 600, whether there is a defect in the EUV mask 2000 may be determined. The analysis apparatus 600 may be or include, for example, a general personal computer (PC), a workstation, or a super computer including an analysis process. According to an example embodiment, the analysis apparatus 600 may be integrally coupled to the detector 500 to form an inspection apparatus.

The apparatus 1000 for inspecting the EUV mask according to an example embodiment may convert the light Bc from the light source 100 into the line light Bl by using the linear zone plate 200 and may remove the higher-order diffracted light component from the line light Bl by using the slit plate 300. Like this, by using the linear zone plate 200 and the slit plate 300, the inspection of the EUV mask 2000 may have improved optical efficiency and a vivid image may be detected. For example, when just a slit plate is used in order to form the line light, most of the light is prevented by a body portion of the slit plate and only a portion of the light passes through a slit, and thus, the optical efficiency becomes very low. However, according to the apparatus 1000 for inspecting the EUV mask according to an example embodiment, light is concentrated into the line light Bl by using the linear zone plate 200, and thus, most of the light that is incident may be maintained and the optical efficiency may become very high. Also, only the higher-order diffracted light component may be removed from the light by using the slit plate 300, and thus, the high optical efficiency may be secured and a vivid image may be obtained.

Meanwhile, the apparatus 1000 for inspecting the EUV mask according to an example embodiment may form the line light Bl by using the linear zone plate 200 and may move the EUV mask 2000 via the movement of the stage 400, and thus, the EUV mask 2000 may be captured as a line scan image by using a line scan camera or a TDI camera. Thus, the EUV mask 2000 may be inspected at a high speed. For reference, the light Bc from the light source 100 may be formed to have a circular spot shape by using a lens and/or a circular zone plate. However, when the EUV mask 2000 is inspected by using the circular spot light, the line scan image may not be captured, and thus, the EUV mask 2000 may not be inspected at a high speed.

The apparatus 1000 for inspecting the EUV mask according to an example embodiment may obtain the high optical efficiency and a vivid image and precisely inspect the EUV mask 2000 at a high speed, by using the linear zone plate 200, the slit plate 300, the stage 400, and the detector 500 of a TDI camera.

FIG. 2A is a plan view of the linear zone plate 200 of the apparatus 1000 for inspecting the EUV mask of FIG. 1, FIG. 2B is a conceptual view for describing a phenomenon in which light is concentrated by the linear zone plate 200 of FIG. 2A, and FIG. 2C is a conceptual view for describing a shape of the light that is output by the linear zone plate 200 of FIG. 2A.

Referring to FIGS. 2A through 2C, in the apparatus 1000 for inspecting the EUV mask according to an example embodiment, the linear zone plate 200 may include a metal line 210 for blocking light and a plurality of through-holes H through which the light passes. The linear zone plate 200 may convert the light Bc incident from the light source 100 (refer to FIG. 1) into the line light Bl based on a diffraction phenomenon.

The through-holes H may be defined by the metal line 210 and may have a linear form extending in a first direction (e.g., an x direction). For example, the through-holes H may have a rectangular structure which is long in the first direction (the x direction). The metal line 210 may be connected via a partition PW between the through-holes H and may be connected as one. A first plate width W11 of the linear zone plate 200 in the first direction (the x direction) and a second plate width W12 of the linear zone plate 200 in the second direction (the y direction) may have a size for sufficiently receiving the light Bc incident from the light source 100.

For reference, to simply explain the principle of forming line light by using the linear zone plate, the linear zone plate basically has a structure in which a transparent line and a non-transparent line are alternately arranged, and light passing through the linear zone plate is diffracted around the non-transparent line. Here, the diffracted light may be concentrated into a focus having a linear form via constructive interference by adjusting a distance between the lines, so that the line light is formed.

In the apparatus 1000 for inspecting the EUV mask according to an example embodiment, the metal line 210 of the linear zone plate 200 may correspond to the non-transparent line and the through-holes H may correspond to the transparent line. Also, in the linear zone plate 200, widths of the through-holes which are at a central portion of the linear zone plate 200, the widths being in the second direction (the y direction), may be greater than widths of the through-holes which are at edge portions of the linear zone plate 200, the edge portions being in the second direction (the y direction), the widths being in the second direction (the y direction). As shown in FIG. 2A, the widths of the through-holes H in the second direction (the y direction) may decrease from the central portion of the linear zone plate 200 to the edge portions of the linear zone plate 200, the edge portions being in the second direction (the y direction).

Meanwhile, in order to maintain the general shape of the linear zone plate 200, the metal line 210 may be connected via the partition PW. However, according to an example embodiment, the linear zone plate 200 may be realized as a structure in which the metal line 210 is arranged on a transparent supporting substrate. In this structure, the partition wall PW may be omitted. Also, according to an example embodiment, the non-transparent line may not be limited to a metal and may include other materials for blocking or absorbing light.

As shown in FIG. 2C, the line light Bl formed by passing through the linear zone plate 200 may include not only a basic optical component B10, which is a zero-order diffracted light component, but also higher-order diffracted light components ±Bl1, ±Bl2, [ . . . ], etc. The higher-order diffracted light components ±Bl1, ±Bl2, [ . . . ], etc. may operate as noise for the detector 500 to obtain a vivid image of an inspected portion of the EUV mask 2000. Thus, the higher-order diffracted light components ±Bl1, ±Bl2, [ . . . ], etc. may be desired to be removed. In the apparatus 1000 for inspecting the EUV mask according to an example embodiment, the higher-order diffracted light components may be removed from the line light Bl of the linear zone plate 200, via the slit plate 300 to be described hereinafter.

Figure 3A:
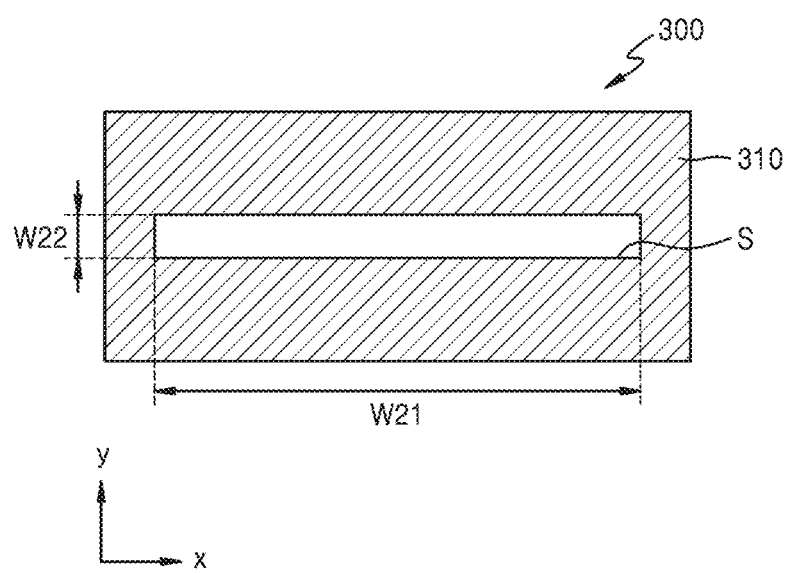
FIG. 3A is a plan view of a slit plate in the apparatus for inspecting the EUV mask of FIG. 1.
Figure 3B:
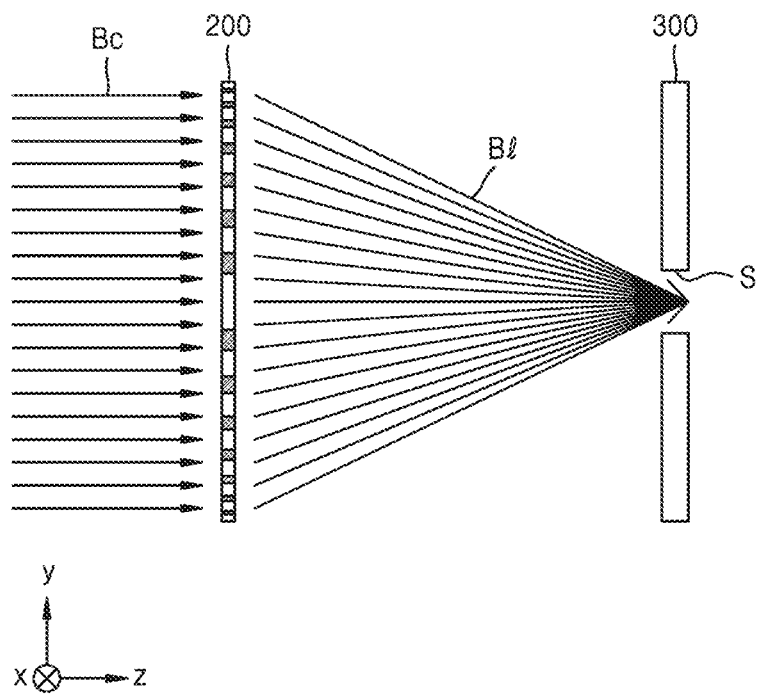
FIG. 3B is a conceptual view for describing a phenomenon in which a higher-order diffracted light component is removed from light, via the slit plate of FIG. 3A.
Figure 3C:
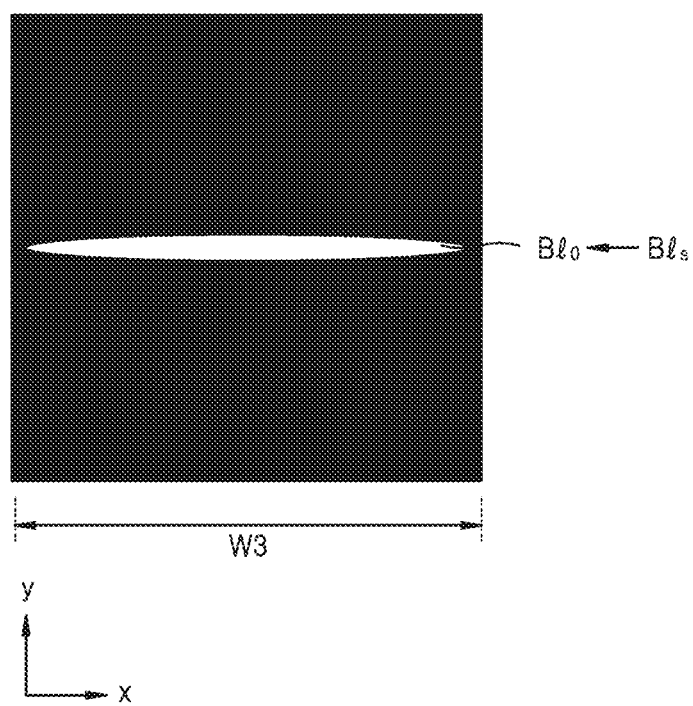
FIG. 3C is a conceptual view for describing a shape of light that is output via the slit plate of FIG. 3A.

FIG. 3A is a plan view of the slit plate 300 in the apparatus 1000 for inspecting the EUV mask of FIG. 1, FIG. 3B is a conceptual view for describing a phenomenon in which higher-order diffracted light components of light are suppressed via the slit plate 300 of FIG. 3A, and FIG. 3C is a conceptual view for describing a shape of the light output via the slit plate 300 of FIG. 3A.

Referring to FIGS. 3A through 3C, in the apparatus 1000 for inspecting the EUV mask according to an example embodiment, the slit plate 300 may include a body 310 and a slit S. The slit plate 300 may suppress the higher-order diffracted light components from the line light Bl of the linear zone plate 200. For example, the slit plate 300 may suppress the ±1$^{st}$-order or greater diffracted light component from the line light Bl of the linear zone plate 200. Accordingly, the slit plate 300 may output the line light Bls including only the basic optical component B10. Meanwhile, the higher-order diffracted light components removed by the slit plate 300 are not limited to the ±1$^{st}$-order or greater diffracted light component. For example, according to an example embodiment, the ±2$^{nd}$-order or greater diffracted light component may be removed by the slit plate 300. Also, according to an example embodiment, the basic optical component B10 may also be removed by the slit plate 300, and a shape of the slit S may be changed such that only a specific diffracted light component may be output.

The body 310 of the slit plate 300 may include metal. However, materials of the body 310 are not limited to metal. For example, the body 310 may include materials other than metal, which are capable of suppressing or absorbing light.

The slit S of the slit plate 300 may be formed at a central portion of the body 310, as a linear form extending in a first direction (e.g., an x direction). For example, the slit S may have a rectangular shape that is long in the first direction (the x direction). A first slit width W21 of the slit S in the first direction (the x direction) may be sufficient to accommodate a width of the line light Bl from the linear zone plate 200 in the first direction (the x direction). Also, a second slit width W22 of the slit S in a second direction (e.g., a y direction) may be sufficient to suppress the higher-order diffracted light components from the line light Bl of the linear zone plate 200.

As shown in FIG. 3C, the line light Bls having passed through the slit plate 300 may include the basic optical component B10 of the line light Bl of the linear zone plate 200 and may selectively include the ±n$^{th}$-order diffracted light component. Meanwhile, a width W3 of the line light Bls in the first direction (the x direction) may correspond to the first slit width W21 of the slit S.

Figure 4A:
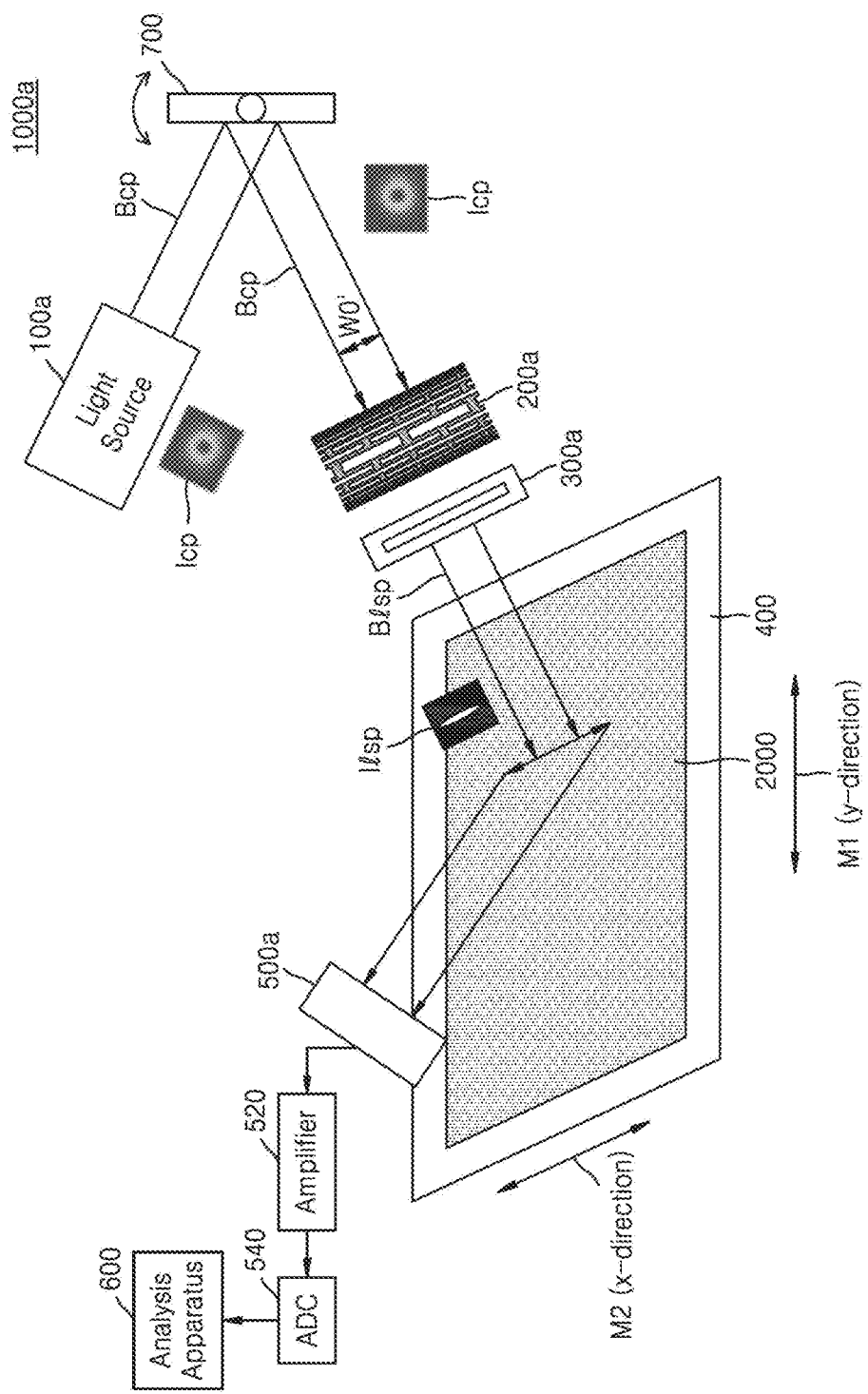
FIG. 4A is a structural view schematically illustrating an apparatus for inspecting an EUV mask, according to an example embodiment.
Figure 4B:
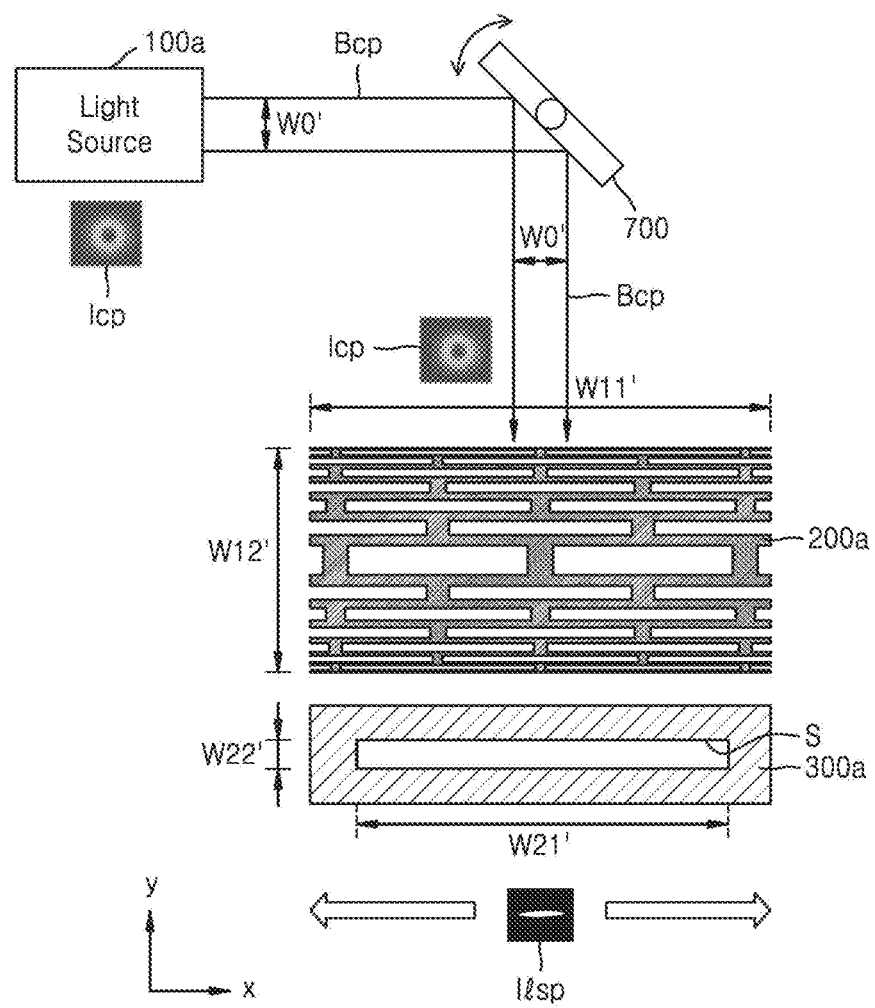
FIG. 4B is a structural view showing, in more detail, a light source for a slit plate in the apparatus for inspecting the EUV mask of FIG. 4A.
Figure 4C:
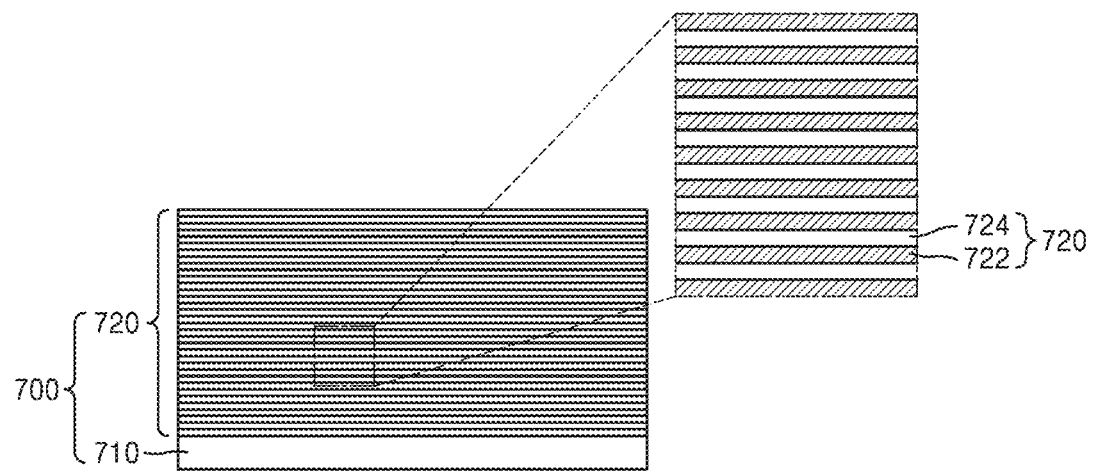
FIG. 4C is a cross-sectional view showing a scan mirror in more detail.
Figure 4D:
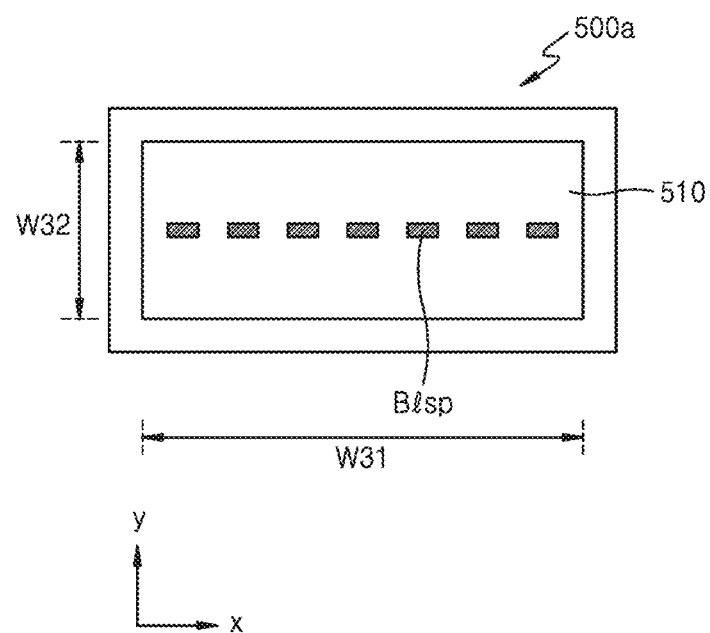
FIG. 4D is a conceptual view for describing a pixel portion of a detector in more detail.

FIG. 4A is a structural view schematically showing an apparatus 1000a for inspecting an EUV mask according to an example embodiment, FIG. 4B is a structural view showing, in more detail, a light source 100a to a slit plate 300a in the apparatus 1000a for inspecting the EUV mask of FIG. 4A, FIG. 4C is a cross-sectional view showing, in more detail, a scan mirror 700, and FIG. 4D is a conceptual view for describing, in more detail, a pixel portion of a detector. The aspects described above with reference to FIGS. 1A through 3C will be briefly described or will not be described.

Referring to FIGS. 4A through 4D, the apparatus 1000a for inspecting the EUV mask according to an example embodiment may differ from the apparatus 1000 for inspecting the EUV mask of FIG. 1 in that in the apparatus 1000a for inspecting the EUV mask, light Bcp of the light source 100a may have a small size, a scan mirror 700 may further be provided, and the detector 500 is or includes a one-pixel detector. In more detail, in the apparatus 1000a for inspecting the EUV mask according to an example embodiment, the light source 100a may generate and output the light Bcp, which has a small size and a circular shape. For example, the size of the light Bcp from the light source 100a may have an initial width W0' of about several µms to dozens of µms. However, the size of the light Bcp from the light source 100a is not limited thereto.

In the apparatus 1000a for inspecting the EUV mask according to an example embodiment, the size of the light Bcp of the light source 100a is small, and thus, there may be a limit to scan the whole EUV mask 2000 via the movement of the stage 400 as in the case of the apparatus 1000 for inspecting the EUV mask of FIG. 1. Accordingly, the apparatus 1000a for inspecting the EUV mask according to an example embodiment may further include the scan mirror 700. The scan mirror 700 may rotate so that the light Bcp of the light source 100*a* may be irradiated by being moved/reflected in a first direction (e.g., an x direction), which is a scan direction. Accordingly, the EUV mask 2000 may be scanned via the movement of the light Bcp of the light source 100*a* in the first direction (the x direction).

As shown in FIG. 4B, in the apparatus 1000*a* for inspecting the EUV mask according to an example embodiment, the linear zone plate 200*a* may have a greater size than the light Bcp of the light source 100*a*. For example, when the light Bcp of the light source 100*a* has the initial width W0' of about several μms in the first direction (the x direction), which is the scan direction, a first plate width W11' of the linear zone plate 200*a* in the first direction (the x direction) may be about dozens of μms to about hundreds of μms. However, the size of the light Bcp of the light source 100*a* and the first plate width W11' of the linear zone plate 200*a* are not limited the described numerical values. Each of FIGS. 4A and 4B illustrates pictures Icp about the light Bcp of the light source 100*a* below the light source 100*a* and above the linear zone plate 200*a*.

A second plate width W12' of the linear zone plate 200*a* in a second direction (e.g., a y direction) may have a sufficient size to accommodate the light Bcp of the light source 100*a*. For example, since the light Bcp of the light source 100*a* has the circular shape, a size of the light Bcp of the light source 100*a* in the second direction (they direction), which is not the scan direction, may be substantially the same as a size of the light Bcp of the light source 100*a* in the first direction (the x direction). Also, the second plate width W12' of the linear zone plate 200*a* may have several times the size of the light Bcp of the light source 100*a*. However, the size of the light Bcp of the light source 100*a* and the second plate width W12' of the linear zone plate 200*a* are not limited to the described numerical values.

In the apparatus 1000*a* for inspecting the EUV mask according to an example embodiment, the light Bcp of the light source 100*a* may be converted to line light by the linear zone plate 200*a*. However, since the size of the light Bcp of the light source 100*a* is small, the line light having a small size may be formed via a portion of the linear zone plate 200*a*, rather than the whole linear zone plate 200*a*. Also, when the light Bcp of the light source 100*a* is moved/reflected via the scan mirror 700, the line light having a small size may be formed via another corresponding portion of the linear zone plate 200*a*. In this way, the light Bcp of the light source 100*a* may be converted into the line light and moved/reflected in the first direction (the x direction) via the scan mirror 700 and the linear zone plate 200*a*.

Meanwhile, a slit S of the slit plate 300*a* may have a size corresponding to the movement of the line light output from the linear zone plate 200*a*. For example, a first slit width W21' of the slit S in the first direction (the x direction) may have a sufficient size to accommodate the movement of the line light of the linear zone plate 200*a*. Also, a second slit width W22' of the slit S in the second direction (the y direction) may have a size to remove a higher-order diffracted light component from the line light of the linear zone plate 200*a*. FIGS. 4A and 4B illustrate pictures Ilsp of line light Blsp from which the higher-order diffracted light component is removed, above the EUV mask 2000 and below the slit plate 300*a*, respectively. Arrows at both sides of the picture Ilsp of the line light Blsp of FIG. 4B may denote that the line light Blsp is moved/reflected by the scan mirror 700.

In the apparatus 1000*a* for inspecting the EUV mask according to an example embodiment, the light Bcp of the light source 100*a* may be converted into the line light via the linear zone plate 200*a*, wherein the line light may be moved/reflected in the first direction (the x direction), which is a scan direction, via the scan mirror 700. Also, the higher-order diffracted light component may be removed from the line light via the slit plate 300*a* and the line light, from which the higher-order diffracted light component is removed, may be irradiated onto the EUV mask 2000. Here, the line light, from which the higher-order diffracted light component is removed, may be irradiated onto the EUV mask 2000 by being moved/reflected in the first direction (the x direction), which is the scan direction, via the scan mirror 700.

The scan mirror 700 may rotate to move the light Bcp of the light source 100*a*, and the line light Blsp, in the scan direction, that is, the first direction (the x direction). As shown in FIG. 4C, the scan mirror 700 may include a base layer 710 and a reflective multi-layer 720 formed on the base layer 710. The base layer 710 may include quartz. However, materials of the base layer 710 are not limited to quartz. The reflective multi-layer 720 may have a structure in which dozens of Mo layers and Si layers are stacked, e.g. alternately stacked. For example, the scan mirror 700 may be realized as the Galvano mirror. The scan mirror 700 may have substantially the same structure and material as the blank mask described above. However, structures and materials of the scan mirror 700 are not limited thereto.

In the apparatus 1000*a* for inspecting the EUV mask according to an example embodiment, a detector 500*a* may be or include a one-pixel detector. The detector 500*a* may detect light generated when the line light Blsp is irradiated onto the EUV mask 2000 and reflected from the EUV mask 2000. Meanwhile, in the apparatus 1000*a* for inspecting the EUV mask according to an example embodiment, the line light Blsp may be moved/reflected in the first direction (the x direction) by the scan mirror 700, and correspondingly, the light reflected from the EUV mask 2000 may be moved/reflected in the first direction (the x direction). Thus, a pixel 510 in the detector 500*a* may have a size to detect all of the line light Blsp that is moved/reflected in the first direction (the x direction).

In more detail, a first pixel width W31 of the pixel 510 of the detector 500*a* in the first direction (the x direction) may have a size to detect all of the line light Blsp moved/reflected by the scan mirror 700. In FIG. 4D, small squares in the pixel 510 may correspond to the line light Blsp. Seven line light components indicated in the pixel 510 may correspond to optical signals output through the ADC 540 using a sampling signal. However, the number of the line light components indicated in the pixel 510 is not limited to seven (7). For example, six (6) or less line light components or eight (8) or more line light components may be indicated in the pixel 510 according to a size of the pixel 510 and the sampling signal of the ADC 540.

Meanwhile, a second pixel width W32 of the pixel 510 of the detector 500*a* in the second direction (the y direction) is not related to the scan direction, and thus, it may be sufficient when the second pixel width W32 is greater than the width of the line light Blsp in the second direction (they direction). However, in order to increase the stability of the detection, the second pixel width W32 of the pixel 510 may be several times greater than the width of the line light Blsp in the second direction (the y direction).

Meanwhile, in FIG. 4D, the seven line light components are indicated in the pixel 510 of the detector 500*a*, with the same intervals. However, according to an example embodiment, the line light components be indicated with different intervals. As described above, the line light Blsp illustrated in FIG. 4D may correspond to the optical signal output through the ADC 540. The ADC 540 may convert the optical signal of the line light Blsp, corresponding to an analog signal detected by the detector 500*a*, into an optical signal corresponding to a digital signal, by using a certain sampling signal. Accordingly, based on the sampling signal, the intervals of the line light components indicated in the pixel 510 may be uniform or non-uniform. The intervals of the line light components will be described in more detail with reference to FIGS. 6A through 7B.

The apparatus 1000*a* for inspecting the EUV mask according to an example embodiment may include an amplifier 520 and the ADC 540 connected to a rear end of the detector 500*a*. The amplifier 520 may amplify an optical signal, for example, the optical signal of the line light Blsp, detected by the detector 500*a*. The ADC 540 may convert the optical signal of the line light Blsp, which is an analog signal, into an optical signal, which is a digital signal. In general, a camera may include an amplifier and an ADC, but a one-pixel detector or a PDA detector may not include the amplifier and the ADC. However, according to an example embodiment, the one-pixel detector or the PDA detector may include the amplifier and the ADC.

According to the apparatus 1000*a* for inspecting the EUV mask according to an example embodiment, when a size of the light Bcp of the light source 100*a* is small, the line light Blsp having a small size may be formed by using the linear zone plate 200*a*, and the higher-order diffracted light component may be removed from the line light Blsp by using the slit plate 300*a*. Here, the light Bcp of the light source 100*a* may be moved/reflected in the first direction (the x direction), which is the scan direction, by the scan mirror 700, so that the line light Blsp may be irradiated onto the EUV mask 2000 by being moved/reflected in the first direction (the x direction). Thus, the apparatus 1000*a* for inspecting the EUV mask may inspect the EUV mask 2000 with substantially the same effects as the apparatus 1000 for inspecting the EUV mask of FIG. 1. For example, the linear zone plate 200*a* and the slit plate 300*a* may have substantially the same sizes in the first direction (the x direction) as the linear zone plate 200 and the slit plate 300 of the apparatus 1000 for inspecting the EUV mask of FIG. 1, and in this case, the time for inspecting the EUV mask 2000 of the apparatus 1000*a* for inspecting the EUV mask may be greater than the time for inspecting the EUV mask 2000 of the apparatus 1000 for inspecting the EUV mask, and the time difference may correspond to the scan time of the scan mirror 700 in the first direction (the x direction). However, when the scan operation of the scan mirror 700 in the first direction (the x direction) is automatically performed, there may not be a great increase in the time for inspecting the EUV mask 2000.

Figure 5:
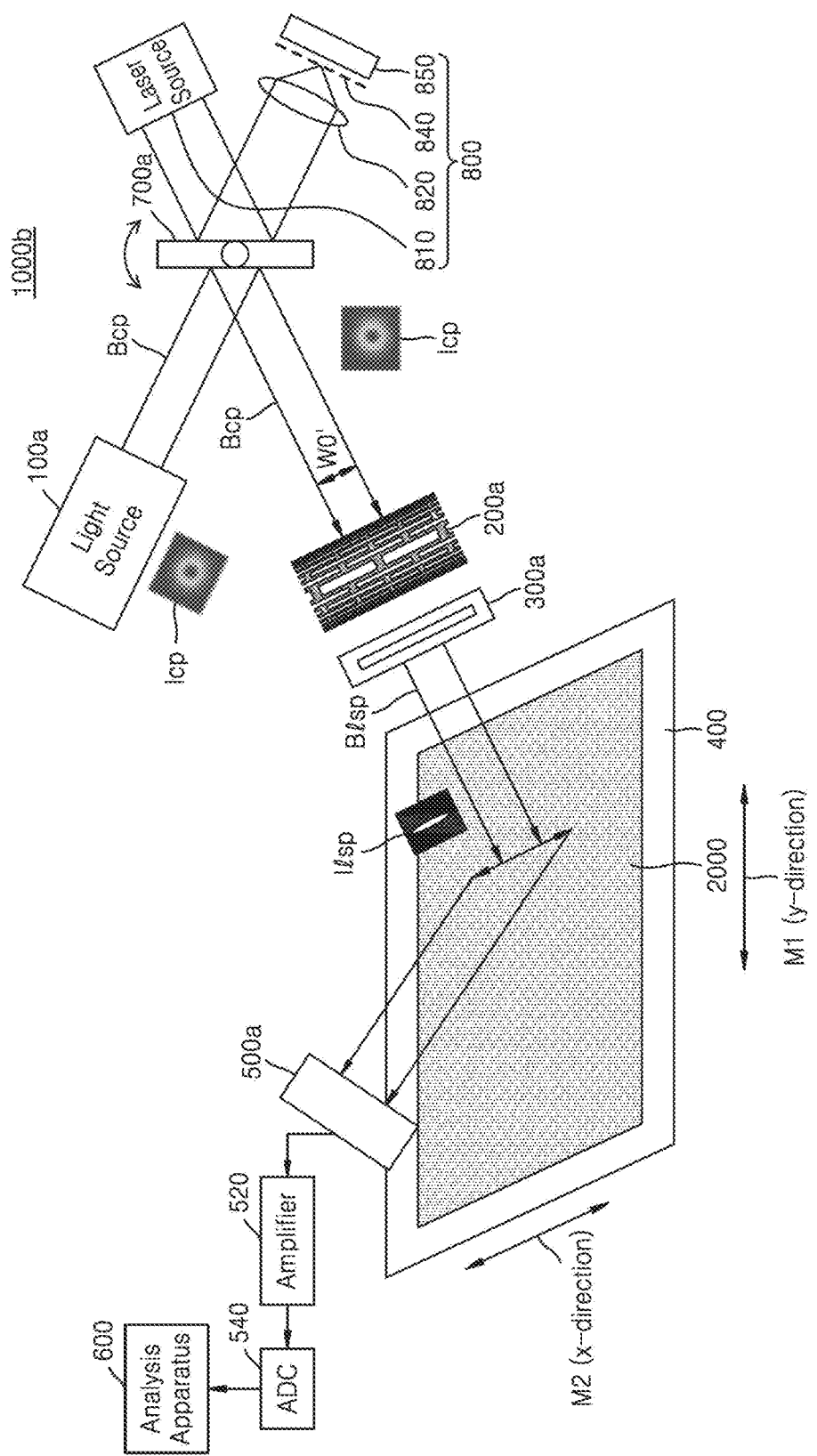
FIG. 5 is a structural view schematically illustrating an apparatus for inspecting an EUV mask, according to an example embodiment.

FIG. 5 is a structural view schematically showing an apparatus 1000*b* for inspecting an EUV mask according to an example embodiment. The aspects described above with reference to FIGS. 1 through 4D will be briefly described or will not be described.

Referring to FIG. 5, the apparatus 1000*b* for inspecting the EUV mask according to an example embodiment may differ from the apparatus 1000*a* for inspecting the EUV mask of FIG. 4A in that a scan mirror 700*a* is a double-faced mirror and a time-adjusting optical device 800 for uniformly outputting movement of light via the scan mirror 700*a* may further be provided. In detail, in the apparatus 1000*b* for inspecting the EUV mask according to an example embodiment, the scan mirror 700*a* may be the double-faced mirror performing reflection at both surfaces. For example, the scan mirror 700*a* may reflect the light Bcp of the light source 100*a* via any one surface thereof so that the light Bcp is incident into the linear zone plate 200*a*, and may reflect a laser beam from a laser diode 810 via the other surface thereof so that the laser beam is incident into a condensing lens 820. The scan mirror 700*a* may be realized by forming the reflective multi-layer 720 (refer to FIG. 4C) at both surfaces of the base layer 710 (refer to FIG. 4C). According to an example embodiment, the scan mirror 700*a* may be realized as a structure in which the base layer is omitted.

Meanwhile, the apparatus 1000*b* for inspecting the EUV mask according to an example embodiment may further include the time-adjusting optical device 800 arranged at a different end from the scan mirror 700*a*. The time-adjusting optical device 800 may include the laser diode 810, the condensing lens 820, a grid plate 840, and a laser detector 850. The laser diode 810 may generate and output a laser beam. The condensing lens 820 may condense the laser beam onto the grid plate 840. Grids having the same intervals may be formed on the grid plate 840. The laser detector 850 may detect the laser beam that is output through the grid plate 840.

Since the apparatus 1000*b* for inspecting the EUV mask according to an example embodiment includes the time-adjusting optical device 800, the apparatus 1000*b* for inspecting the EUV mask may detect the laser beam that is output by passing through grids of the grid plate 840, by using the laser detector 850, and may use the detected laser beam as a sampling signal of the ADC 540. Accordingly, the movement of the light Bcp of the light source 100*a* and the line light Blsp in the first direction (the x direction) via rotation of the scan mirror 700*a* may be uniformly output. The principle for uniformly outputting the movement of the light by using the time-adjusting optical device 800 will be described in more detail with reference to FIGS. 6A through 7B.

Figure 6A:
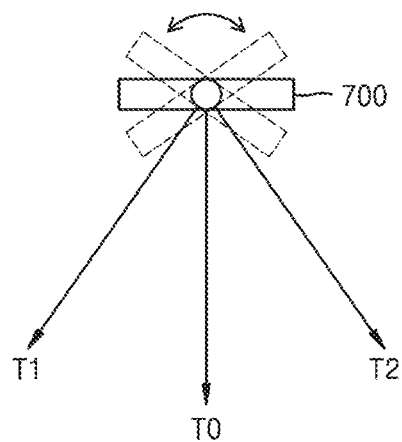
FIGS. 6A through 6C are conceptual views for explaining that, in the apparatus for inspecting the EUV mask of FIG. 4A, movement of light via rotation of a scan mirror becomes non-uniform.
Figure 6B:
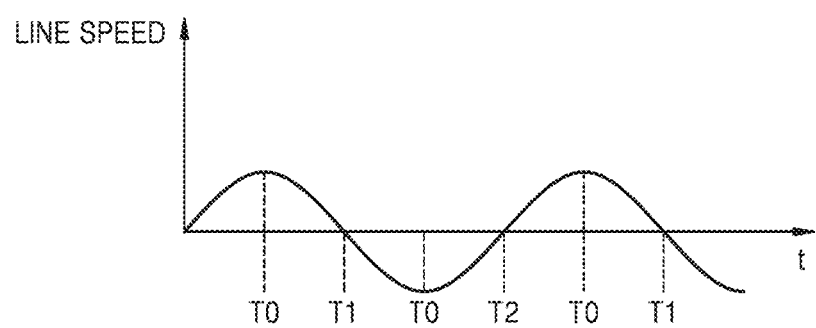
Figure 6C:
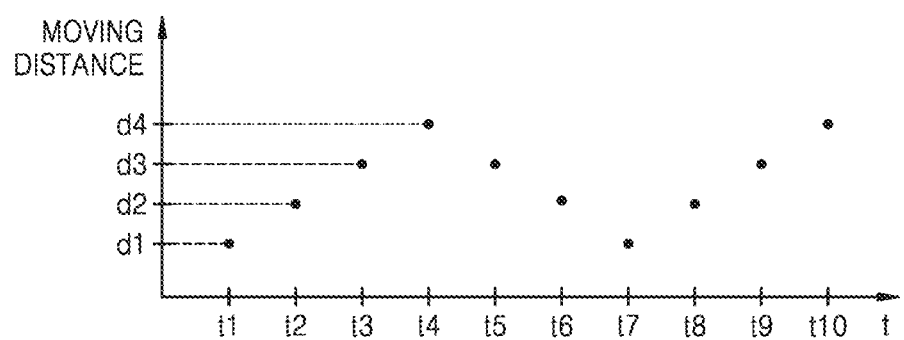

FIGS. 6A through 6C are conceptual views for describing that the movement of light via rotation of the scan mirror 700 may become non-uniform, in the apparatus 1000*a* for inspecting the EUV mask of FIG. 4A.

Referring to FIGS. 6A through 6C, as illustrated in FIG. 6A, the light reflected by the scan mirror 700 may be moved/reflected between locations T1 and T2 via the rotation of the scan mirror 700. Here, the scan mirror 700 may rotate by having a certain cycle, as a general pendulum. When the scan mirror 700 rotates by having a certain cycle, a line speed of the light reflected from the scan mirror 700 at a certain location may have a sine wave form as illustrated in FIG. 6B. For example, the direction of the light reflected from the scan mirror 700 may be reversed at the locations T1 and T2, and thus, the line speed may become 0, and the line speed at a location T0, which is between the locations T1 and T2, may become the highest or the lowest. In addition, the ADC 540 (refer to FIG. 5) may convert an analog signal into a digital signal by using sampling signals having the same intervals. The reflected light that is output through the ADC 540 may have a different moving distance on a straight line, as illustrated in FIG. 6C, due to a different line speed. For example, in a certain section, the moving distance of the reflected light may be increased, and in another section, the moving distance of the reflected light may be decreased.

As a result, when the ADC 540 performs the AD conversion by using the sampling signals having the same intervals, that is, the same temporal intervals, the line light components that are output through the ADC 540 may not maintain the same intervals, due to the different line speed of the line light Blsp. Accordingly, the EUV mask 2000 may not be uniformly inspected. For reference, a method of directly rotating the scan mirror by using the same temporal intervals and the same rotation angles may be considered. However, in the case of this method, accurately control the scan mirror may be difficult and/or may cost much time.

Figure 7A:
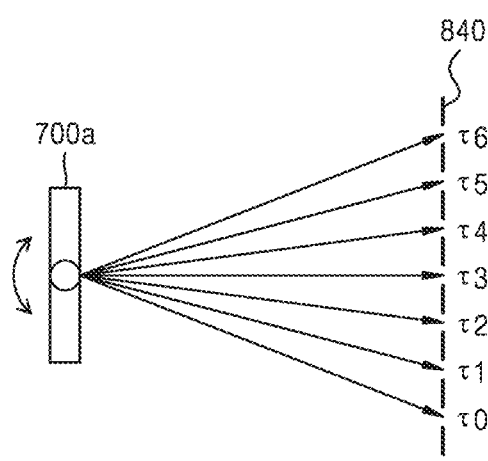
FIGS. 7A and 7B are conceptual views for explaining a principle according to which, in the apparatus for inspecting the EUV mask of FIG. 5, movement of light is uniformly output by using a time-adjusting optical device.
Figure 7B:
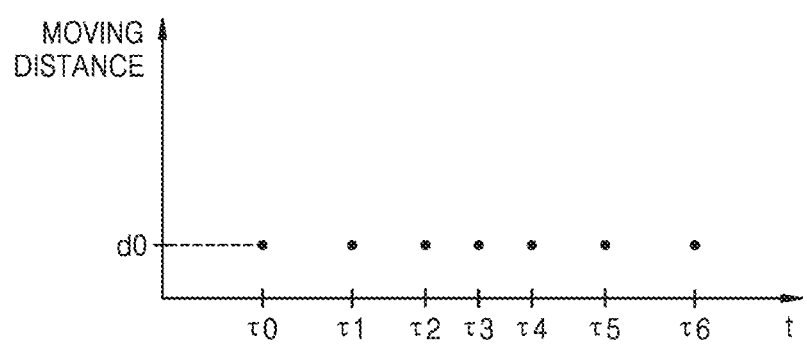

FIGS. 7A and 7B are conceptual views for describing a principle in which the movement of light is uniformly output by using the time-adjusting optical device 800, in the apparatus 1000b for inspecting the EUV mask of FIG. 5.

Referring to FIGS. 7A and 7B, the grids of the grid plate 840 may be arranged in the same intervals and a laser beam reflected from the scan mirror 700a may be condensed via the condensing lens 820 (refer to FIG. 5) and irradiated onto the grid plate 840. For convenience, FIG. 7A does not illustrate the condensing lens 820. As described above, the scan mirror 700a may periodically rotate like a pendulum, and the laser beam reflected from the scan mirror 700a may linearly move on the grid plate 840 via the rotation of the scan mirror 700a.

Meanwhile, the laser detector 850 (refer to FIG. 5) may be arranged behind the grid plate 840 and the laser detector 850 may detect the laser beam output through a gap between the grids and check the time thereof. In FIG. 7A, the times $\tau 0$, $\tau 1$, ... $\tau 6$, in which the laser beam is detected, are indicated at the gaps between the grids. Thus, when the ADC 540 (refer to FIG. 5) performs AD conversion on the line light Blsp by using sampling signals having intervals of the detected times, the line light Blsp may be output at the same intervals as the interval of the grids. Also, when the time intervals are increased by a factor of two, such as $\tau 0$, $\tau 2$, $\tau 4$, $\tau 6$, etc., the line light Blsp may be output by having the same intervals corresponding to the two times the interval of the grids. FIG. 7B shows that the line light Blsp may be output by having the same moving distance d0, by giving a difference to the time intervals.

Meanwhile, it is described that the laser detector 850 checks the times in which the laser beam is detected and the intervals of the times are used for the sampling signals of the ADC 540. However, this may be for convenience of explanation. Actually, without additionally checking the times of the detection of the laser beam, the laser beam obtained by the laser detector 850 may be used as the sampling signal of the ADC 540.

Figure 8:
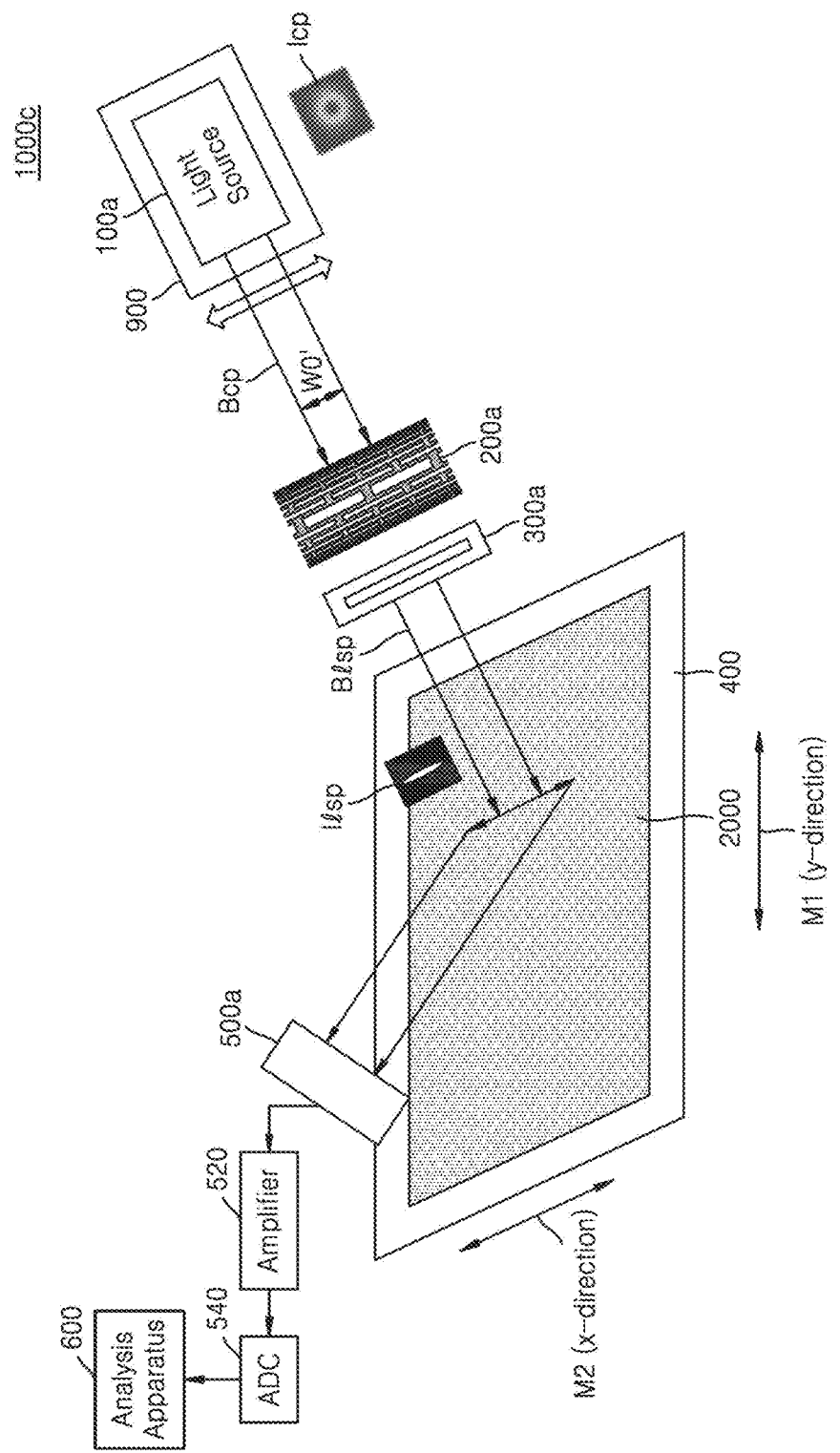
FIGS. 8 through 10B are structural views schematically illustrating apparatuses for inspecting an EUV mask, according to example embodiments.
Figure 9:
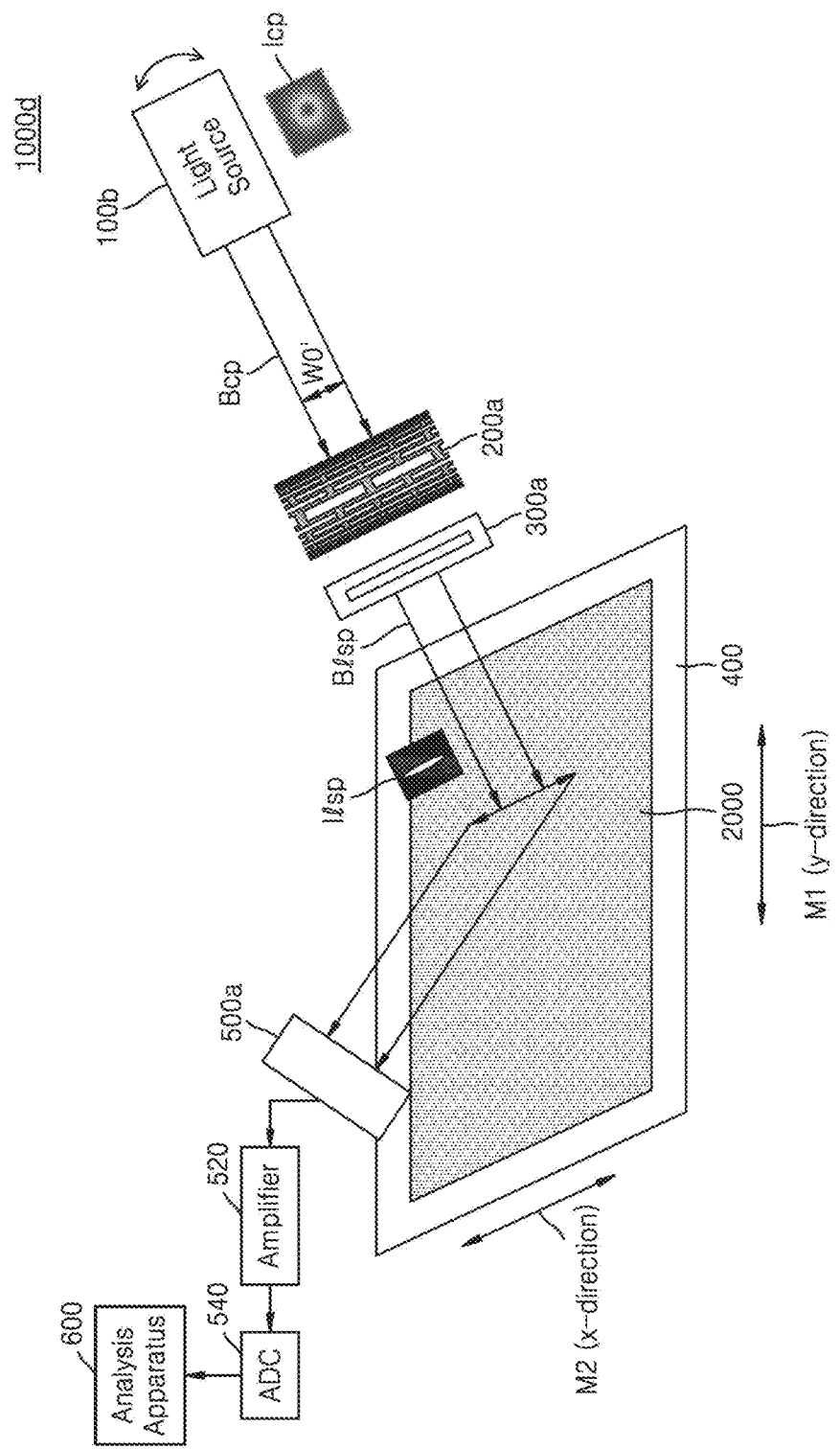
Figure 10A:
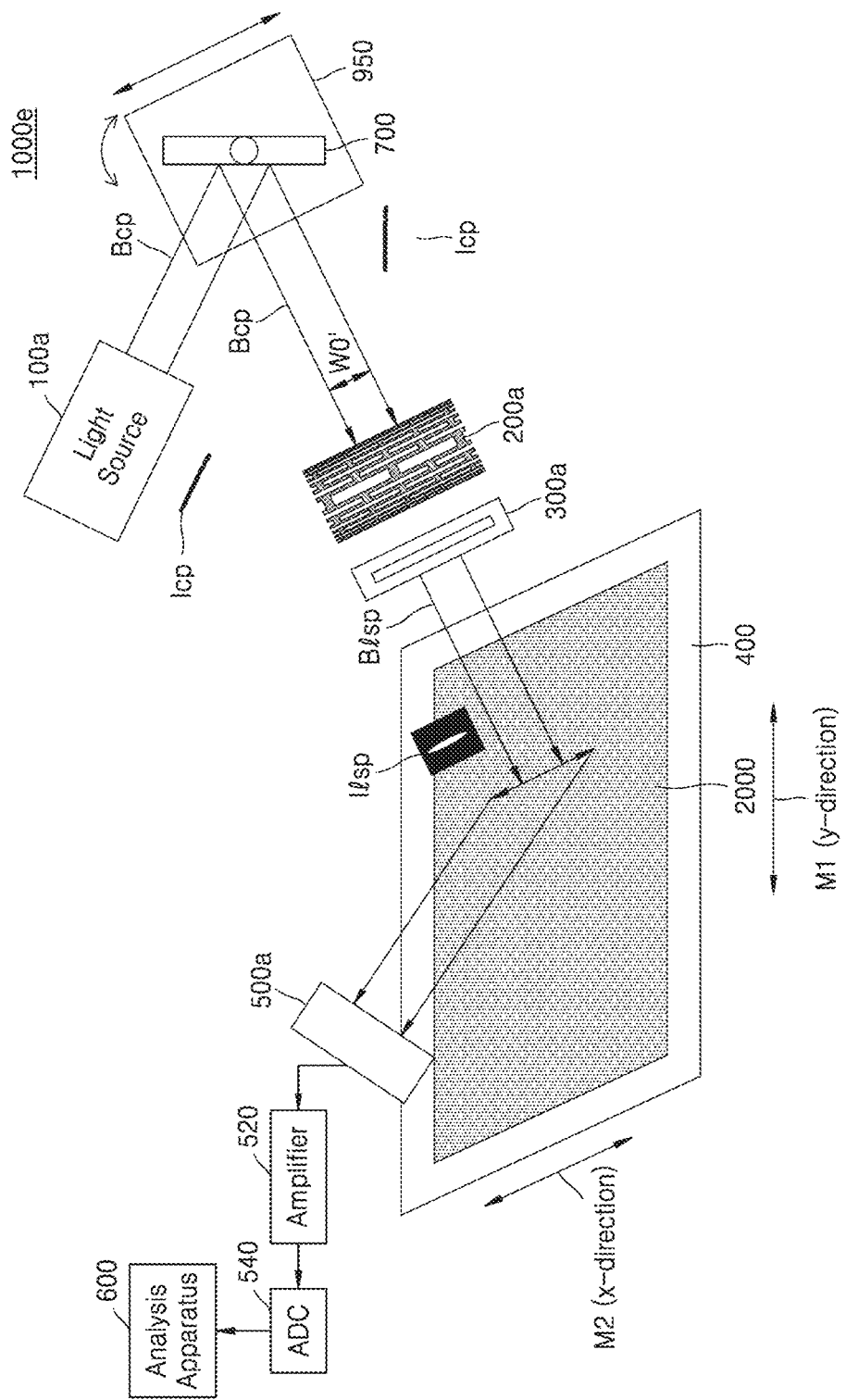
Figure 10B:
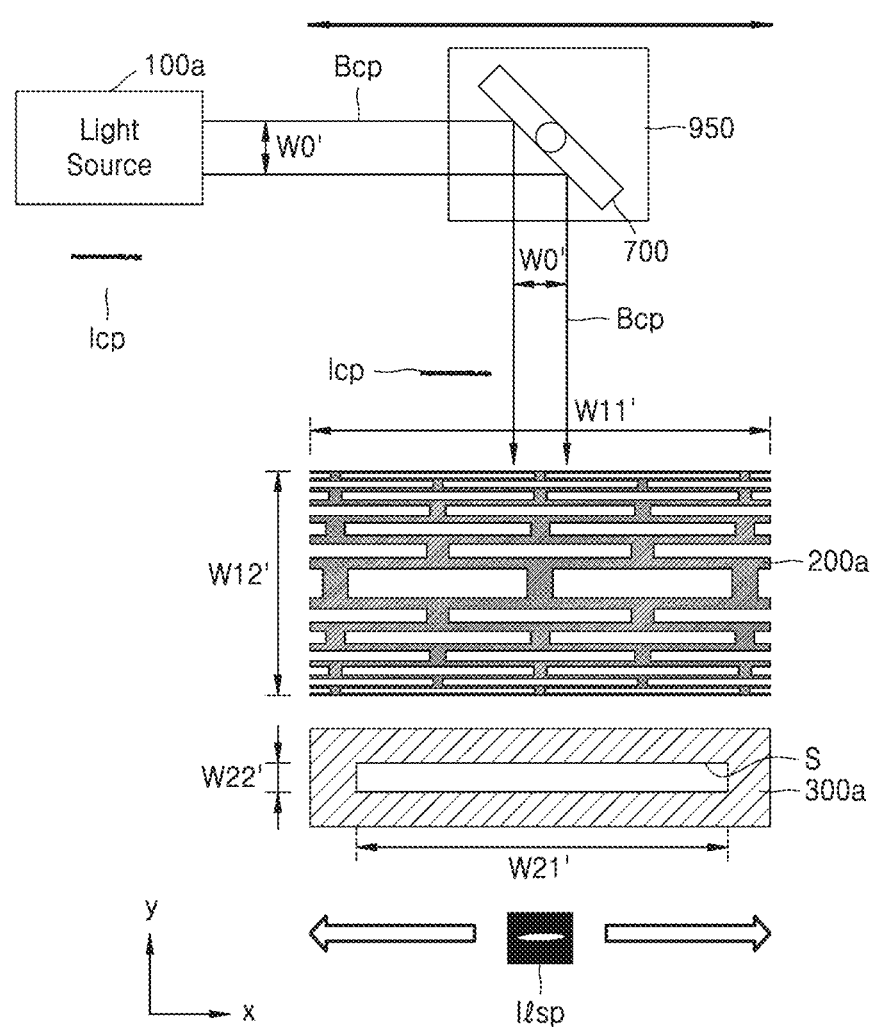

FIGS. 8 through 10B are structural views schematically showing apparatuses 1000c, 1000d, and 1000e for inspecting an EUV mask, according to example embodiments. FIG. 10B is the structural view showing, in more detail, the light source 100a to the slit plate 300a in the apparatus 1000e for inspecting the EUV mask of FIG. 10A. The aspects described above with reference to FIGS. 1 through 4D will be briefly described or will not be described.

Referring to FIG. 8, the apparatus 1000c for inspecting the EUV mask may differ from the apparatus 1000a for inspecting the EUV mask of FIG. 4A in that the apparatus 1000c for inspecting the EUV mask may include a parallel movement device 900 rather than the scan mirror 700. In detail, in the apparatus 1000c for inspecting the EUV mask according to an example embodiment, the light source 100a may generate and output the light Bcp having a small size, the detector 500a may be or include a one-pixel detector, and the amplifier 520 and the ADC 540 may be provided, and thus, the apparatus 1000c for inspecting the EUV mask may be substantially the same as the apparatus 1000a for inspecting the EUV mask of FIG. 4A.

Meanwhile, the apparatus 1000a for inspecting the EUV mask of FIG. 4A includes the scan mirror 700 to move the light Bcp from the light source 100a in the first direction (the x direction), which is the scan direction. However, the apparatus 1000c for inspecting the EUV mask according to an example embodiment may include the parallel movement device 900 to directly perform parallel movement of the light source 100a in the first direction (the x direction) to move the light Bcp in the first direction (the x direction), which is the scan direction.

The parallel movement device 900 may continually move the light source 100a or discontinuously move the light source 100a by having a certain time interval. When the parallel movement device 900 continually moves the light source 100a, a time interval of the sampling signals of the ADC 540 may be appropriately determined by taking into account a movement speed of the light source 100a, a size of a pixel of the detector 500a, etc. This may be because the issue in the above using the scan mirror may not occur, since the light source 100a is moved/reflected in parallel and the line speed of the light Bcp in the scan direction is the same. Meanwhile, when the parallel movement device 900 discontinuously moves the light source 100a, the time interval with which the light source 100a is moved/reflected may be used as the time interval of the sampling signals of the ADC 540.

Referring to FIG. 9, the apparatus 1000d for inspecting the EUV mask according to an example embodiment may differ from the apparatus 1000a for inspecting the EUV mask of FIG. 4A or the apparatus 1000c for inspecting the EUV mask of FIG. 8 in that in the apparatus 1000d for inspecting the EUV mask, a light source 100b may directly move the light Bcp in a first direction (e.g., an x direction), which is a scan direction. In detail, in the apparatus 1000d for inspecting the EUV mask according to an example embodiment, the light Bcp may be directly moved/reflected in the first direction (the x direction), which is the scan direction, via rotation of the light source 100a. Also, similarly to the apparatus 1000a for inspecting the EUV mask of FIG. 4A, in the apparatus 1000d for inspecting the EUV mask according to an example embodiment, the light source 100b may generate and output the light Bcp having a small size, the detector 500a may be or include a one-pixel detector, and the amplifier 520 and the ADC 540 may be provided.

Referring to FIGS. 10A and 10B, the apparatus 1000e for inspecting the EUV mask may differ from the apparatus 1000a for inspecting the EUV mask and the apparatus 1000c for inspecting the EUV mask of FIGS. 4A and 8, respectively, in that the apparatus 1000e for inspecting the EUV mask may include the scan mirror 700 and a parallel movement device 950. In detail, in the apparatus 1000e for inspecting the EUV mask according to an example embodiment, the light source 100a may generate and output the light Bcp having a small size, the detector 500a may be or include a one-pixel detector, and the amplifier 520 and the ADC 540 may be provided, and thus, the apparatus 1000e for inspecting the EUV mask may be substantially the same as the apparatus 1000a for inspecting the EUV mask of FIG. 4A or the apparatus 1000c for inspecting the EUV mask of FIG. 8.

Also, the apparatus 1000e for inspecting the EUV mask according to an example embodiment may be similar to the apparatus 1000a for inspecting the EUV mask of FIG. 4A, since the apparatus 1000e for inspecting the EUV mask includes the scan mirror 700, and may be similar to the apparatus 1000c for inspecting the EUV mask of FIG. 8, since the apparatus 1000e for inspecting the EUV mask includes the parallel movement device 950. However, the apparatus 1000e for inspecting the EUV mask according to an example embodiment may differ from the apparatus 1000a for inspecting the EUV mask of FIG. 4A and the apparatus 1000c for inspecting the EUV mask of FIG. 8 in that the apparatus 1000e for inspecting the EUV mask may move the light Bcp from the light source 100a in a first direction (e.g., an x direction), which is a scan direction, by moving the scan mirror 700 by using the parallel movement device 950.

In other words, the apparatus 1000e for inspecting the EUV mask according to an example embodiment may differ from the apparatus 1000a for inspecting the EUV mask of FIG. 4A, in that in the apparatus 1000e for inspecting the EUV mask, the scan mirror 700 does not rotate. Also, the apparatus 1000e for inspecting the EUV mask according to an example embodiment may differ from the apparatus 1000c for inspecting the EUV mask of FIG. 8 in that in the apparatus 1000e for inspecting the EUV mask, the scan mirror 700, rather than the light source 100a, is moved/reflected in the first direction (the x direction), which is the scan direction.

The parallel movement device 950 may continually move the scan mirror 700 or discontinuously move the scan mirror 700 by having a certain time interval. When the parallel movement device 950 continually moves the scan mirror 700, a time interval of the sampling signals of the ADC 540 may be appropriately determined by taking into account a movement speed of the scan mirror 700, a size of a pixel of the detector 500a, etc. This may be because the issue, which may occur in the apparatus 1000a for inspecting the EUV mask of FIG. 4A, may not occur, since the scan mirror 700 is moved/reflected in parallel and the line speed of the light Bcp in the scan direction is the same. Meanwhile, when the parallel movement device 950 discontinuously moves the scan mirror 700, the time interval with which the scan mirror 700 is moved/reflected may be used as the time interval of the sampling signals of the ADC 540.

In the apparatus 1000e for inspecting the EUV mask according to an example embodiment, the light source 100a may be fixed and the scan mirror 700 may be moved/reflected in parallel in the first direction (the x direction) so that the light may be irradiated onto the linear zone plate 200a by being stably moved/reflected in the first direction (the x direction). Also, in the apparatus 1000e for inspecting the EUV mask according to an example embodiment, the scan mirror 700 does not rotate, and thus, the time-adjusting optical device 800 of the apparatus 1000b for inspecting the EUV mask of FIG. 5 may not be utilized, and the scan mirror 700 may not be double-faced.

Figure 11:
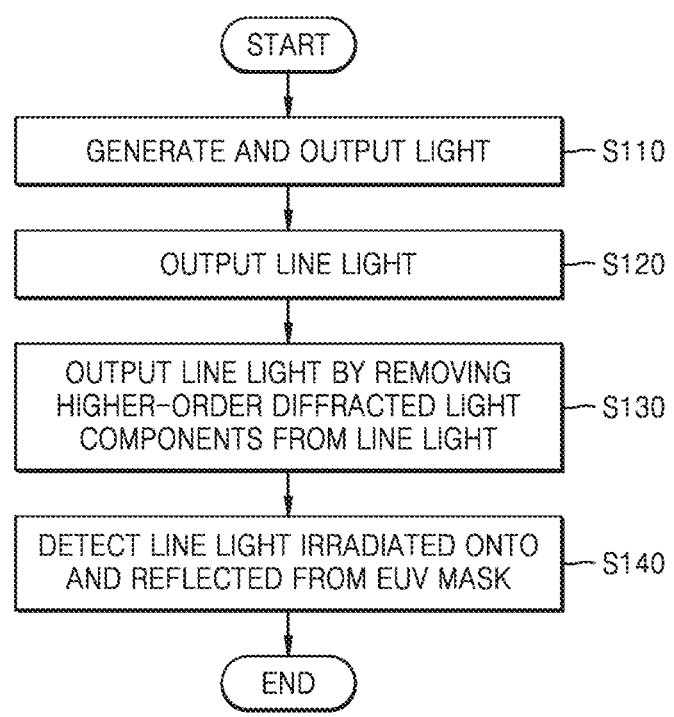
FIGS. 11 through 13 are flowcharts schematically illustrating a method of inspecting an EUV mask, according to example embodiments.
Figure 12:
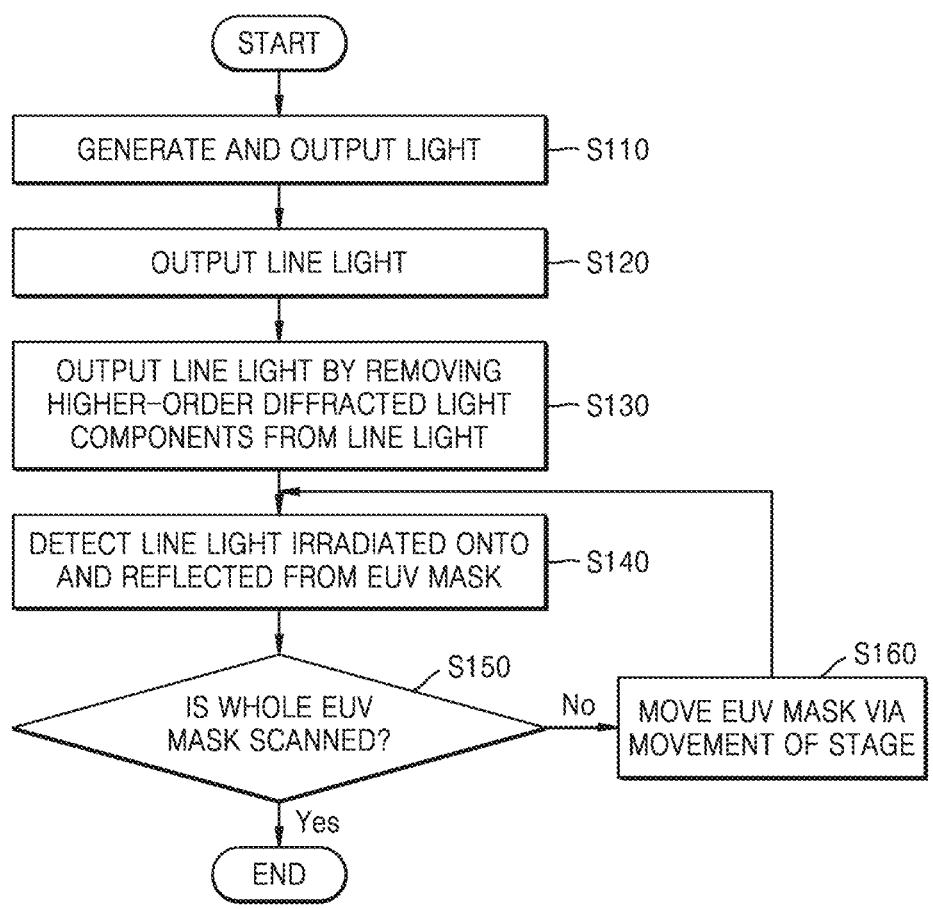
Figure 13:
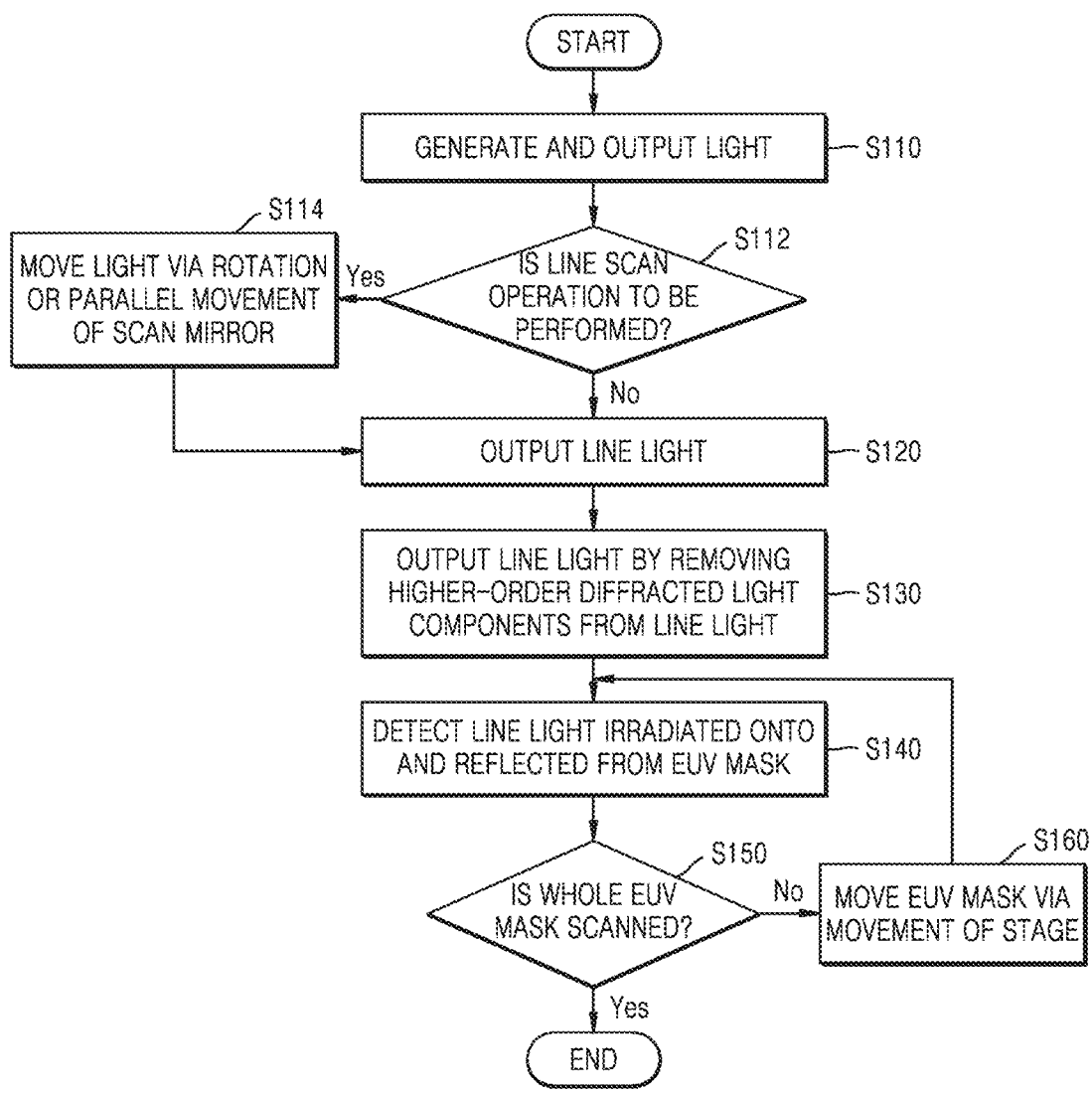

FIGS. 11 through 13 are flowcharts schematically showing methods of inspecting an EUV mask, according to example embodiments. Descriptions will be given with reference to FIGS. 1 through 10B together, and the aspects already described with reference to FIGS. 1 through 10B will be briefly described or will not be described.

Referring to FIG. 11, according to the method of inspecting the EUV mask, according to an example embodiment, first, the light sources 100, 100a, and 100b may generate and output the lights Bc and Bcp in operation S110. Here, the lights Bc and Bcp may have a circular light shape, and for example, may be any one of EUV rays, DUV rays, and X-rays, which have short wavelengths. Also, the lights Bc and Bcp may be lights having a relatively large size of about hundreds of μms to about dozens of mms, as in the apparatus 1000 for inspecting the EUV mask of FIG. 1, and may be lights having a relatively small size of about several μms to about dozens μms, as in the apparatuses 1000a, 1000b, 1000c, 1000d, and 1000e for inspecting the EUV masks of FIGS. 4A, 5, 8, 9, and 10A, respectively.

Next, by using the linear zone plates 200 and 200a, the light from the light sources 100, 100a, and 100b may be converted into the line light Bl and output in operation S120. When a size of the light Bc from the light source 100 is large, the line light Bl having a large width in the first direction (the x direction) may be formed by using the whole linear zone plate 200, and when the size of the light Bcp from the light sources 100a and 100b is small, the line light Bl having a small width in the first direction (the x direction) may be formed by using a portion of the linear zone plate 200a.

Then, the higher-order diffracted light components may be removed from the line light Bl from the linear zone plates 200 and 200a by using the slit plates 300 and 300a, and the line light Bl, from which the higher-order diffracted light components are removed, may be output, in operation S130. Likewise, when the line light Bl of the linear zone plate 200 has a large width, the higher-order diffracted light components of the line light Bl may be removed by using the whole slit S of the slit plate 300, and when the line light Bl of the linear zone plate 200a has a small width, the higher-order diffracted light components of the line light Bl may be removed by using a portion of the slit S of the slit plate 300a.

The line lights Bls and Blsp output from the slit plates 300 and 300a may be irradiated onto the EUV mask 2000, which is an object to be inspected, and the detectors 500 and 500a may detect the line lights Bls and Blsp reflected from the EUV mask 2000, in operation S140. For example, when the line light Bls of the slit plate 300 has a large width, the line light Bls reflected from the EUV mask 2000 may be detected by using the detector 500 realized as a TDI camera. Meanwhile, when the line light Blsp of the slit plate 300a has a small width, the line light Blsp reflected from the EUV mask 2000 may be detected by being scanned in the first direction (the x direction) by using the detector 500a realized as a one-pixel detector.

Thereafter, although not shown, the line lights Bls and Blsp detected by the detectors 500 and 500a may be analyzed by the analysis apparatus 600 to determine whether there is a defect in the EUV mask 2000. Meanwhile, the EUV mask 2000, which is the object to be inspected, may include a blank mask, a patterned mask, or a mask covered with pellicles.

Referring to FIG. 12, the method of inspecting the EUV mask according to an example embodiment may first include the generating and outputting of the light (S110) through the detecting of the line light (S140). The aspects related to the generating and outputting of the light (S110) through the detecting of the line light (S140) are described with respect to the method of inspecting the EUV mask of FIG. 11.

Next, whether the whole EUV mask 2000 is scanned may be determined in operation S150. When the whole EUV mask 2000 is not scanned (No), the stage 400 may be moved/reflected to move the EUV mask 2000 in operation S160. The stage 400 may move on an x-y plane in the first direction (the x direction) and the second direction (the y direction). Via the movement of the stage 400, the EUV mask 2000 may also move on the x-y plane in the first direction (the x direction) and the second direction (the y direction). Then, the method may proceed to operation S140 of detecting the line light to detect the line light.

When the whole EUV mask 2000 is scanned (Yes), the method of inspecting the EUV mask may be ended. Meanwhile, before ending the method of inspecting the EUV mask, whether there is a defect in the EUV mask 2000 may be determined by using the analysis apparatus 600.

Referring to FIG. 13, the method of inspecting the EUV mask according to an example embodiment may first include the generating and outputting of the light (S110). The generating and outputting of the light (S110) is described with respect to the method of inspecting the EUV mask of FIG. 11.

Next, whether to perform a line scan operation in the first direction (the x direction), which is the scan direction may be determined in operation S112. When the line scan operation is to be performed (Yes), the light Bcp of the light source 100a may be moved/reflected via rotation of the scan mirrors 700 and 700a or parallel movement of the scan mirrors 700 and 700a, in operation S114. The light Bcp of the light source 100a may be moved/reflected in the first direction (the x direction), which is the scan direction, via the rotation of the scan mirrors 700 and 700a or the parallel movement of the scan mirrors 700 and 700a in the first direction (the x direction). For example, when the light Bcp from the light source 100a has a small size as in the embodiments of the apparatuses 1000a, 1000b, 1000c, 1000d, and 1000e for inspecting the EUV masks of FIGS. 4A, 5, 8, 9, and 10A, respectively, the line scan operation may be performed. However, when the light Bc from the light source 100 has a large size as in the embodiment of the apparatus 1000 for inspecting the EUV mask of FIG. 1, the line scan operation may not have to be performed.

Meanwhile, the light Bcp may be moved/reflected in the first direction (the x direction) via parallel movement of the light source 100a or via direct rotation of the light source 100b, as in the case of the apparatuses 1000c and 1000d for inspecting the EUV masks of FIGS. 8 and 9, respectively, rather than via the rotation or the parallel movement of the scan mirrors 700 and 700a. Then, the method may proceed to operation S120 of outputting the line light. Also, when the line scan operation is not to be performed (No), the method may directly proceed to operation S120 of outputting the line light.

Thereafter, the outputting of the line light (S120) through the moving of the EUV mask (S160) may be performed. The outputting of the line light (S120) through the moving of the EUV mask (S160) are described with reference to the methods of inspecting the EUV masks of FIGS. 11 and 12.

Figure 14:
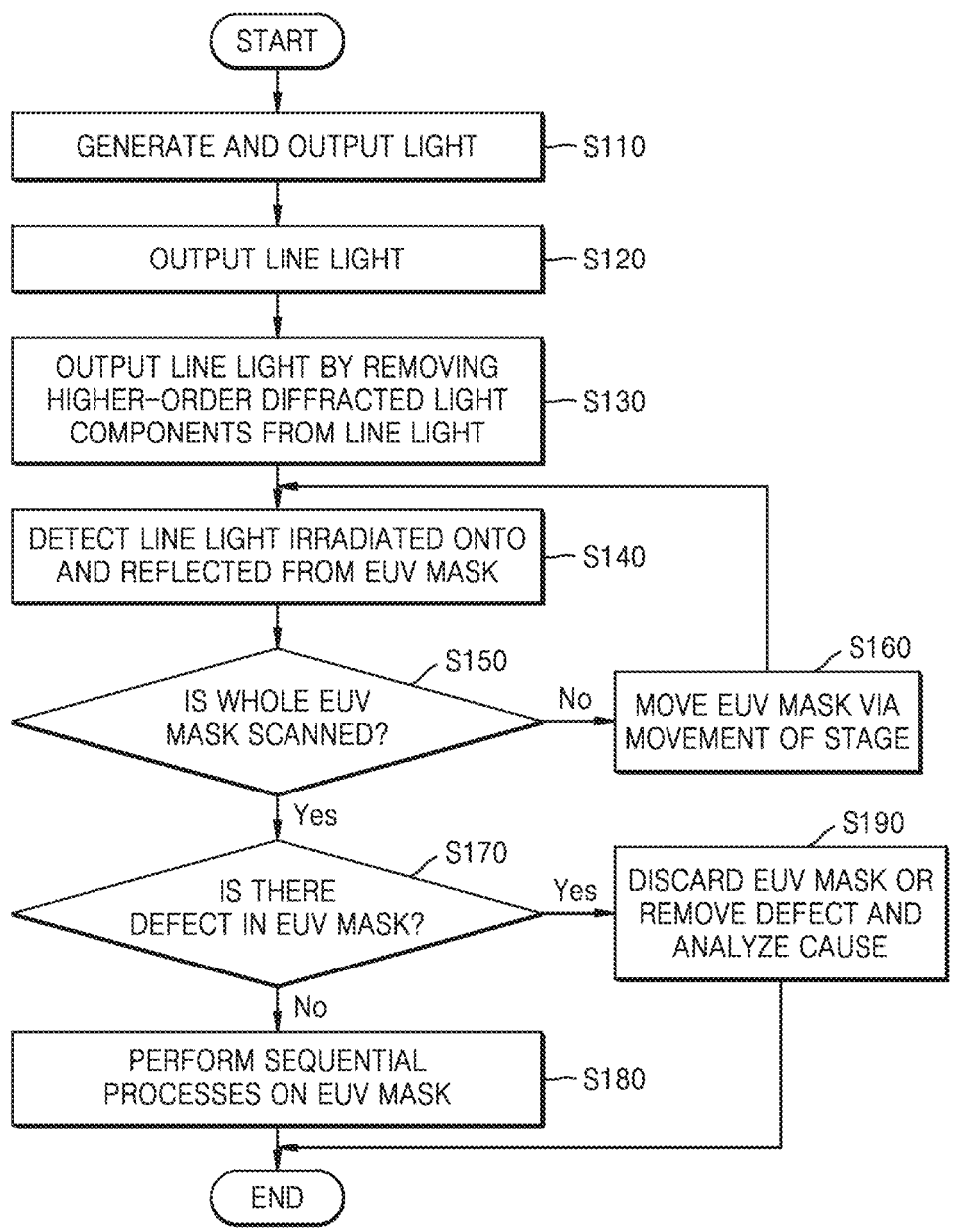
FIG. 14 is a flowchart schematically illustrating a method of manufacturing an EUV mask, in which a method of inspecting an EUV mask is used, according to example embodiments.

FIG. 14 is a flowchart schematically showing a method of manufacturing an EUV mask, the method using the methods of inspecting the EUV mask, according to the embodiments. Descriptions will be given by referring to FIGS. 1 through 10B together, and the aspects described with reference to FIGS. 11 through 13 will be briefly described or will not be described.

Referring to FIG. 14, the method of manufacturing the EUV mask according to an example embodiment may first include the generating and outputting of the light (S110) through the moving of the EUV mask (S160). The generating and outputting of the light (S110) through the moving of the EUV mask (S160) are described with reference to the methods of inspecting the EUV masks of FIGS. 11 and 12. Meanwhile, the method of manufacturing the EUV mask according to an example embodiment may further include the determining of whether to perform the line scan operation (S112) and the moving of the light Bcp of the light source 100a (S114) included in the method of inspecting the EUV mask of FIG. 13.

Meanwhile, according to the method of manufacturing the EUV mask according to an example embodiment, when the scanning operation is performed on the whole EUV mask 2000 (Yes), whether there is a defect in the EUV mask 2000 may be determined in operation S170. Here, the defect of the EUV mask 2000 may vary according to types of the EUV mask 20000. For example, in the case of a blank mask, there may be a defect in a structure or a degree of reflectivity of a reflective multi-layer, in the case of a patterned mask, there may be a defect in a shape or a size of a pattern of an absorption layer, or introduction of a foreign material, and in the case of a mask covered with pellicles, there may be a defect in the coupling of the pellicles or introduction of a foreign material.

When there is a defect in the EUV mask 2000 (Yes), the EUV mask 2000 may be discarded or the defect may be removed from the EUV mask 2000, and a cause of the defect may be analyzed (S190).

Meanwhile, when there is no defect in the EUV mask 2000 (No), sequential processes may be performed on the EUV mask 2000. For example, when the EUV mask 2000 is a blank mask, a patterning process may be performed on the EUV mask 2000. When the EUV mask 2000 is a patterned mask, a process of covering the EUV mask 2000 with at least one pellicle may be performed. Also, when the EUV mask 2000 is a patterned mask covered with at least one pellicle, a process of finally completing the EUV mask 2000 may be performed. For example, loading, maintaining, or a document process, such as recording of a completion date, etc., may be performed with respect to the EUV mask 2000.

The patterned EUV mask 2000 covered with at least one pellicle that has been finally completed may be used in the manufacturing of a semiconductor device. For example, the patterned EUV mask 2000 covered with at least one pellicle may be used in an EUV photolithography process to expose the pattern onto a substrate. The substrate may be covered with photoresist that reacts to radiation in the EUV range. The substrate may etched to define features corresponding to the pattern on the EUV mask 2000. The features may include, for example, isolation features, gate electrode features, contact feature, via features, metal line features, etc.; however, inventive concepts are not limited thereto.

While inventive concepts has been particularly shown and described with reference to example embodiments thereof, it will be understood that various changes in form and details may be made therein without departing from the spirit and scope of the following claims.

What is claimed is:

1. An apparatus for inspecting an extreme ultraviolet (EUV) mask, the apparatus comprising:
   a light source configured to generate and output light;
   a linear zone plate configured to convert the light from the light source to light having a linear form extending in a first direction;
   a slit plate configured to output the light having the linear form by removing a higher-order diffracted light component from the light having the linear form;
   a stage configured to support the EUV mask;
   a detector configured to detect the light reflected from the EUV mask, in response to the light being irradiated onto and reflected from the EUV mask;
   a scan mirror configured to reflect the light from the light source such that the light is incident to the linear zone plate; and,
   an optical device configured to make the light uniformly move in the first direction,
   wherein the scan mirror comprises a double-faced mirror,
   the optical device comprises a laser diode configured to output a laser beam, a condensing lens configured to concentrate, to a grid plate, the laser beam reflected by the scan mirror, the grid plate comprising a plurality of grid lines having a pitch, and a second detector configured to detect the laser beam from the grid plate, and the second detector is configured to detect the laser beam passing through the plurality of grids and is configured to provide a sampling signal of an analog-digital converter (ADC) to convert an analog signal into a digital signal.

2. The apparatus of claim 1, wherein the linear zone plate includes a structure configured to convert, via diffraction, incident light into the light having the linear form, the light having the linear form extending in the first direction.

3. The apparatus of claim 2, wherein the linear zone plate comprises a metal line configured to block the light and a plurality of through-holes defined by the metal line and through which the light passes, the plurality of through-holes include a linear form extending in the first direction, and widths of the through-holes at a central portion of the linear zone plate are greater than widths of the through-holes located at edge portions of the linear zone plate, the widths of the through-holes at the central and edge portions being widths in a second direction perpendicular to the first direction.

4. The apparatus of claim 1, wherein the slit plate includes a slit extending in the first direction, and the slit has a first width corresponding to a width of the light having the linear form, the first width being in the first direction, and a second width for removing a $\pm 1^{st}$-order or greater diffracted light component from the light having the linear form, the second width being in a second direction perpendicular to the first direction.

5. The apparatus of claim 1, wherein the stage is configured to move on a plane in a first direction and a second direction perpendicular to the first direction, and the entirety of the EUV mask is scanned via the movement of the stage.

6. The apparatus of claim 1, wherein at least one of, (A) the light is reflected in the first direction via rotation of the scan mirror, or (B) the light is reflected in the first direction via parallel movement of the scan mirror.

7. The apparatus of claim 1, wherein the light source comprises:

a plasma-based EUV light source.

8. The apparatus of claim 1, wherein the detector comprises at least one of a line scan camera, a time-delayed integration (TDI) camera, a two-dimensional (2D) camera, a one-pixel detector, or a photo-diode array (PDA) detector.

9. An apparatus for inspecting an extreme ultraviolet (EUV) mask, the apparatus comprising:

a light source configured to generate and output light;

a scan mirror configured to reflect and output the light from the light source by reflecting the light in a first direction;

a linear zone plate configured to output the light from the scan mirror as light having a linear form extending in the first direction;

a slit plate configured to output the light having the linear form by removing a higher-order diffracted light component from the light having the linear form;

a first detector configured to detect the light reflected from the EUV mask, in response to the light being irradiated onto and reflected from the EUV mask;

an analog-digital converter (ADC) configured to convert an analog signal into a digital signal; and an optical device configured to uniformly move the light in the first direction, wherein the scan mirror comprises a double-faced mirror, the optical device comprises a laser diode configured to output a laser beam, a condensing lens configured to concentrate, to a grid plate, the laser beam reflected by the scan mirror, the grid plate comprising a plurality of grid lines having a pitch, and a second detector configured to detect the laser beam from the grid plate, and the second detector is configured to detect the laser beam passing through the plurality of grids and is configured to provide a sampling signal of the ADC.

10. The apparatus of claim 9, wherein the linear zone plate comprises a metal line for blocking the light and a plurality of through-holes defined by the metal line and through which the light passes, and has a structure configured to convert, via diffraction, incident light into the light having the linear form, and the linear zone plate has a width to cover the reflection of the light in the first direction via the scan mirror.

11. The apparatus of claim 9, wherein a slit is in the slit plate, the slit being configured to remove a $\pm 1^{st}$-order or greater diffracted light component from the light having the linear form and extending in the first direction, and the slit has a width to cover the reflection of the light in the first direction via the scan mirror.

12. The apparatus of claim 9, wherein the EUV mask is located on a stage configured to move on a plane in the first direction and a second direction perpendicular to the first direction, and the stage is configured to move such that the entirety of the EUV mask is scanned.

13. The apparatus of claim 9, wherein the light is moved/reflected in the first direction via rotation of the scan mirror, or the light is reflected in the first direction via parallel movement of the scan mirror.

14. The apparatus of claim 9, further comprising:

an amplifier configured to amplify an optical signal from the first detector.

15. The apparatus of claim 9, wherein the first detector comprises a one-pixel detector, and a pixel of the first detector has a width to cover the movement of the light in the first direction via the scan mirror.

* * * * *